US011112094B2

United States Patent
Inayoshi et al.

(10) Patent No.: US 11,112,094 B2
(45) Date of Patent: Sep. 7, 2021

(54) METHOD FOR MANUFACTURING LIGHT-EMITTING DEVICE

(71) Applicant: NICHIA CORPORATION, Anan (JP)

(72) Inventors: Yohei Inayoshi, Komatsushima (JP); Masaaki Katsumata, Anan (JP); Tomohiro Ikeda, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/079,519

(22) Filed: Oct. 26, 2020

(65) Prior Publication Data
US 2021/0041089 A1  Feb. 11, 2021

Related U.S. Application Data

(62) Division of application No. 16/145,689, filed on Sep. 28, 2018, now Pat. No. 10,851,973.

(30) Foreign Application Priority Data

Sep. 29, 2017  (JP) .............................. JP2017-191379

(51) Int. Cl.
*F21V 19/00* (2006.01)
*G02F 1/13357* (2006.01)
(Continued)

(52) U.S. Cl.
CPC .... *F21V 19/0025* (2013.01); *G02F 1/133603* (2013.01); *G02F 1/133608* (2013.01);
(Continued)

(58) Field of Classification Search
CPC .......... F21V 19/0025; G02F 1/133603; G02F 1/133608; H01L 33/62; H05K 1/00; F21Y 2105/16; F21Y 2115/10; F21Y 25/0753
See application file for complete search history.

(56) References Cited

U.S. PATENT DOCUMENTS

2005/0247944 A1   11/2005  Haque et al.
2008/0062688 A1*   3/2008  Aeling ................ F21V 19/0015
                                                                362/241
(Continued)

FOREIGN PATENT DOCUMENTS

JP         05-018839 U      3/1993
JP         2005-322937       11/2005
(Continued)

OTHER PUBLICATIONS

Restriction Requirement issued by the U.S. Patent and Trademark Office for the parent U.S. Appl. No. 16/145,689, dated Jan. 6, 2020.
(Continued)

*Primary Examiner* — Anne M Hines
(74) *Attorney, Agent, or Firm* — Mori & Ward, LLP

(57) ABSTRACT

A method of manufacturing a light-emitting device includes: providing a second base with a plurality of light-emitting elements, the second base having an upper surface on which a pattern of second metal films is formed, the plurality of light-emitting elements being provided on the pattern of second metal films; cutting the second base to singulate the second base into a plurality of connection boards on each of which respective one of the plurality of light-emitting elements is mounted; providing a support board including a first base, the first base being flexible, the first base including a pattern of first metal films; placing the plurality of connection boards on the support board; and forming, for each of the plurality of connection boards, a conductive member so as to be in contact with the pattern of second metal films on the connection board and with the pattern of first metal films.

16 Claims, 11 Drawing Sheets

(51) Int. Cl.
  *H05K 1/00*    (2006.01)
  *H01L 33/62*   (2010.01)
  *F21Y 105/16*  (2016.01)
  *F21Y 115/10*  (2016.01)
  *H01L 25/075*  (2006.01)

(52) U.S. Cl.
  CPC ............... *H01L 33/62* (2013.01); *H05K 1/00* (2013.01); *F21Y 2105/16* (2016.08); *F21Y 2115/10* (2016.08); *H01L 25/0753* (2013.01)

(56) References Cited

U.S. PATENT DOCUMENTS

| | | | |
|---|---|---|---|
| 2014/0327024 | A1 | 11/2014 | Ishihara et al. |
| 2015/0001564 | A1 | 1/2015 | Oguro et al. |

FOREIGN PATENT DOCUMENTS

| | | |
|---|---|---|
| JP | 2009-212171 | 9/2009 |
| JP | 2012-049486 | 3/2012 |
| JP | 2012-109521 | 6/2012 |
| JP | 2012-109587 | 6/2012 |
| JP | 2012-124453 | 6/2012 |
| JP | 2012-124498 | 6/2012 |
| JP | 2014-060462 | 4/2014 |
| JP | 2015-012206 | 1/2015 |
| WO | WO 2013/018783 | 2/2013 |

OTHER PUBLICATIONS

Office Action with Form PTO-892 Notice of Reference Cited issued bu the U.S. Patent and Tradmark Office for the parent U.S. Appl. No. 16/145,689, dated Apr. 20, 2020.

Notice of Allowance issued by the United States Patent and Trademark Office for the parent U.S. Appl. No. 16/145,689, dated Jul. 27, 2020.

* cited by examiner

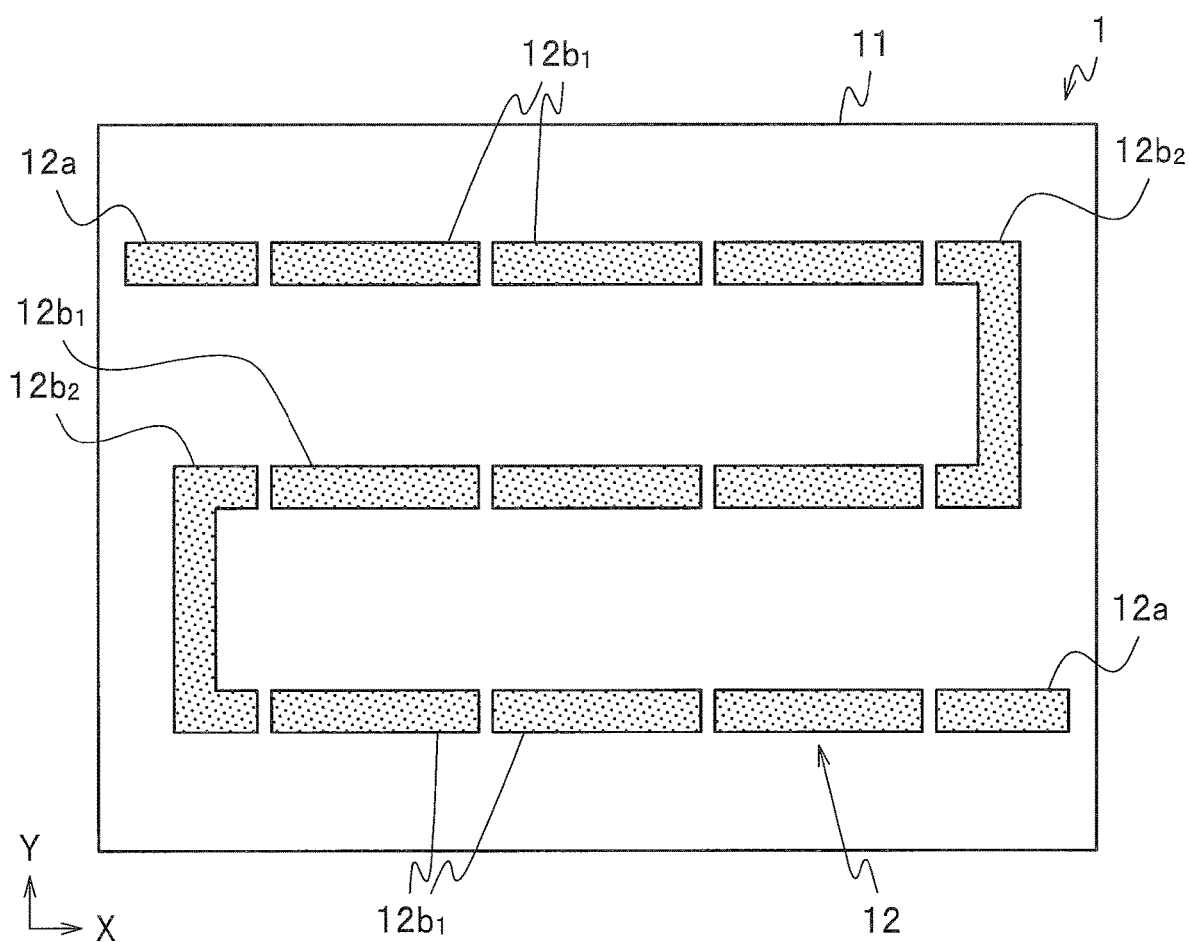

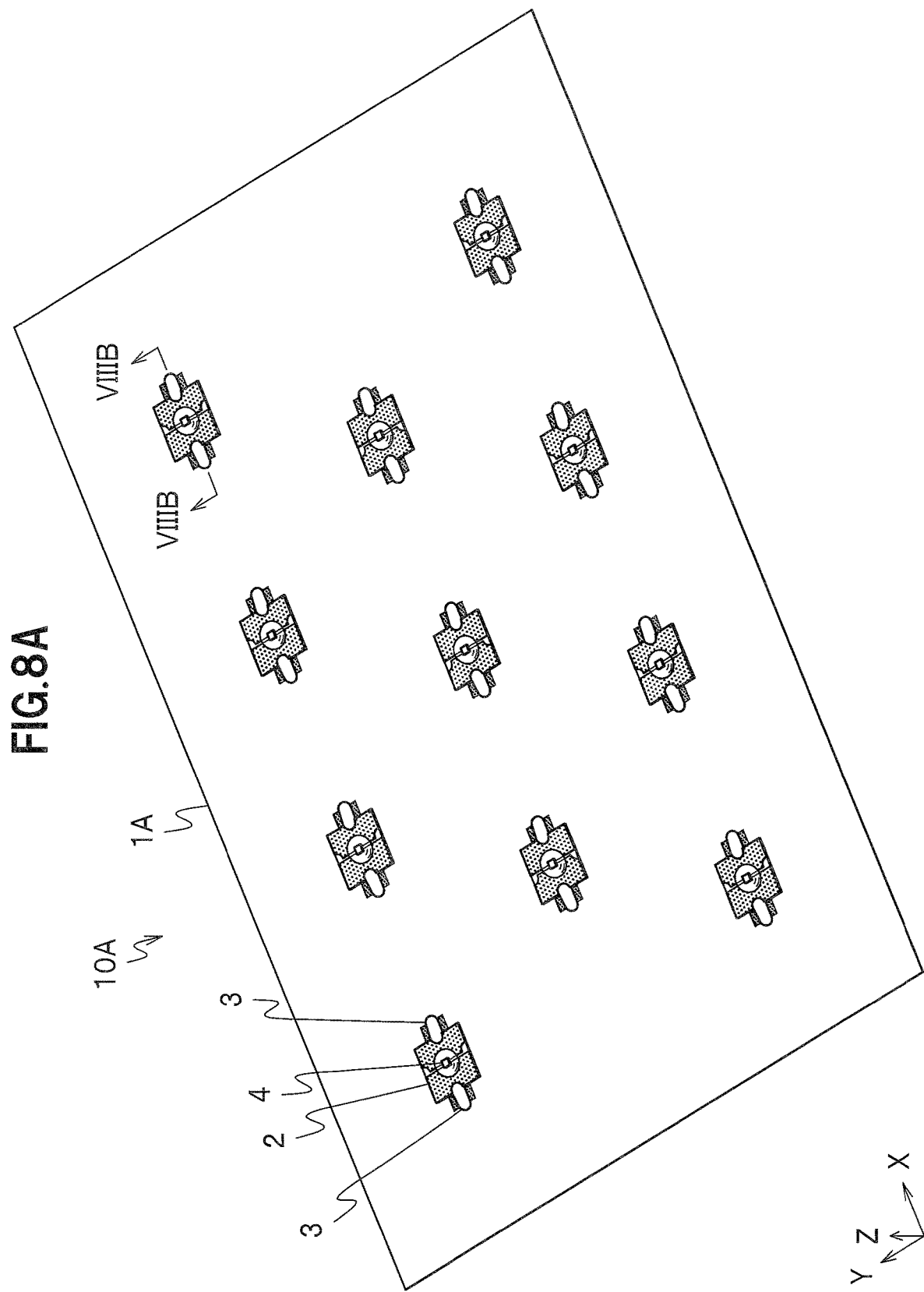

METHOD FOR MANUFACTURING LIGHT-EMITTING DEVICE

CROSS-REFERENCE TO RELATED APPLICATIONS

This is a divisional application of the U.S. patent application Ser. No. 16/145,689 filed on Sep. 28, 2018, which claims priority under 35 U.S.C. § 119 to Japanese Patent Application No. 2017-191379, filed on Sep. 29, 2017, the disclosures of which are incorporated herein by reference.

BACKGROUND OF THE INVENTION

1. Technical Field

The present disclosure relates to a method for manufacturing the light-emitting device.

2. Description of Related Art

As a light source for a backlight of a liquid crystal display (LCD), a light-emitting device in which a plurality of semiconductor light-emitting elements (hereinafter referred to as light-emitting elements) such as light-emitting diodes (LEDs) or laser diodes (LDs) are mounted in an array pattern to emit light in a planar fashion has been used. In such a light-emitting device, light-emitting elements are mounted on a board on which a wiring pattern of metal films has been formed, with certain gaps interposed between the light-emitting elements, in an array pattern. A flexible sheet-like light-emitting device has been developed by adopting a resin film composed of polyimide or the like for a board (see Japanese Patent Publication Nos. 2005-322937 and 2015-12206).

SUMMARY

A method for manufacturing a light-emitting device according to certain embodiments of the present disclosure includes: providing a second base with a plurality of light-emitting elements, the second base having an upper surface on which a pattern of second metal films is formed, the plurality of light-emitting elements being provided on the pattern of second metal films; cutting the second base to singulate the second base into a plurality of connection boards on each of which respective one of the plurality of light-emitting elements is mounted: providing a support board including a flexible first base including a pattern of first metal films; placing the plurality of connection boards on the support board; and, for each of the plurality of connection boards, forming a conductive member so as to be in contact with the pattern of second metal films on the connection board and with the pattern of first metal films.

BRIEF DESCRIPTION OF THE DRAWINGS

The disclosure will become more fully understood from the following detailed description, taken in conjunction with the accompanying figures, in which:

FIG. 3 is a plan view schematically illustrating the configuration of a support board of the light-emitting device according to the embodiment.

FIG. 8A is a perspective view schematically illustrating the configuration of a light-emitting device according to a first modification of the embodiment.

DETAILED DESCRIPTION OF EMBODIMENTS

Figure 1:
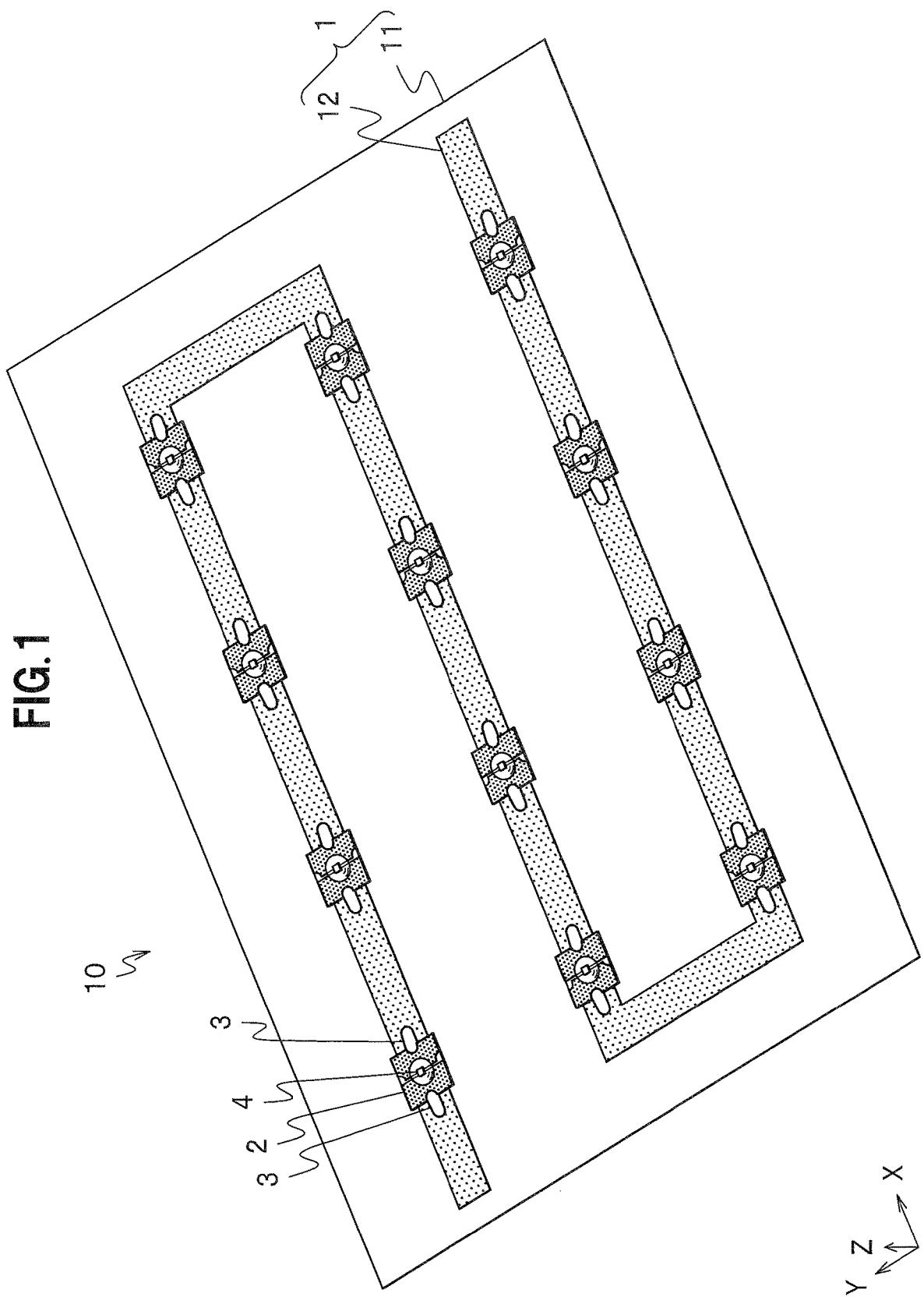
FIG. 1 is a perspective view schematically illustrating the configuration of a light-emitting device according to an embodiment.

Hereinafter, a description will be given of a light-emitting device according to an embodiment of the present disclosure and a method for manufacturing the light-emitting device. The light-emitting device according to the present embodiment is a planar light source to be applied to a direct type backlight for an LCD. The light-emitting device has an upper surface from which light is emitted. Note that drawings referenced in the following descriptions schematically show embodiments of the present disclosure. Thus, in the drawings, sizes of members and positional relationship between members or the like may have been presented in an exaggerated manner, and shapes of members may have been simplified. In certain drawings, XYZ-axis coordinates are presented for the sake of description. Specifically, an X-axis, a Y-axis perpendicular to the X-axis, and a Z-axis perpendicular to the X-axis and the Y-axis may be presented in the drawings. A plane defined by the X-axis and the Y-axis is referred to as an XY-axis plane, which corresponds to a surface of a support board in certain embodiments. Unless stated otherwise, a plane refers to the XY-axis plane. In the present specification, unless otherwise stated, up/down directional relations represented in a cross-sectional view is reflected in descriptions as is. In the following descriptions, members that are the same or analogous will be given the same name or number in principle, and duplicative detailed descriptions will be appropriately omitted.

Light-Emitting Device

Figure 2A:
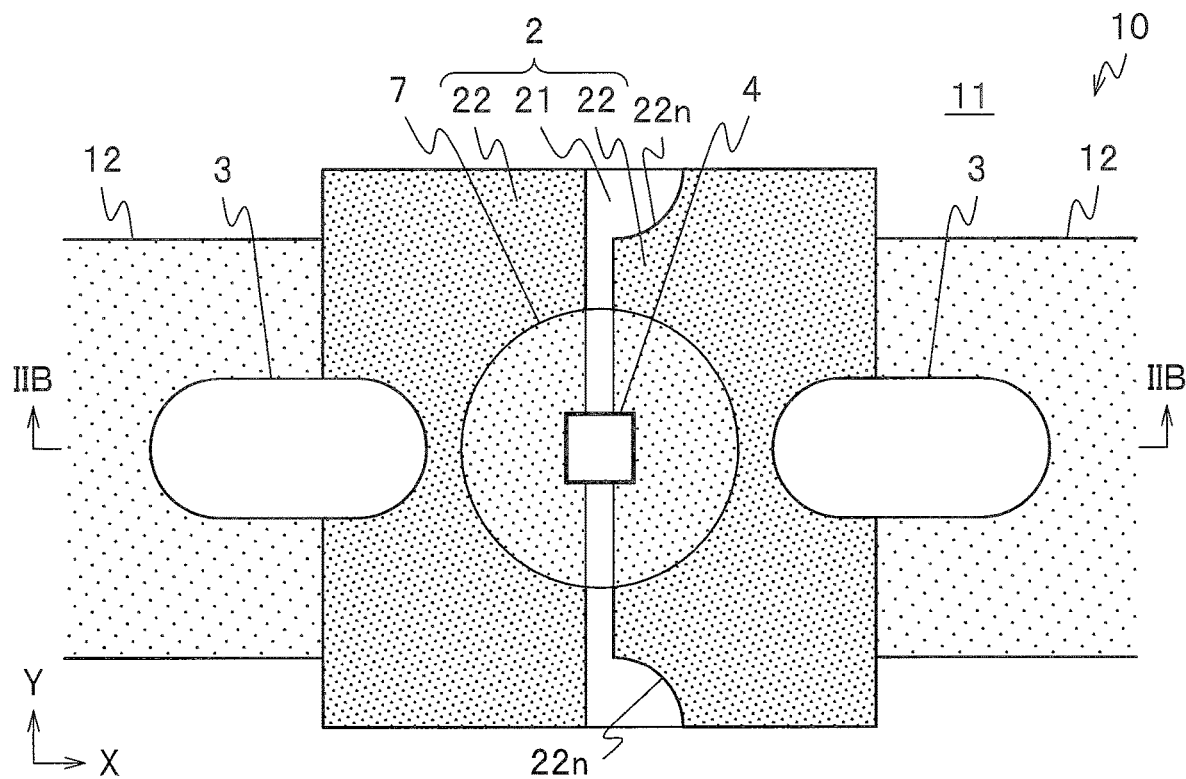
FIG. 2A is an enlarged plan view schematically illustrating a part of the configuration of the light-emitting device according to the embodiment.
Figure 2B:
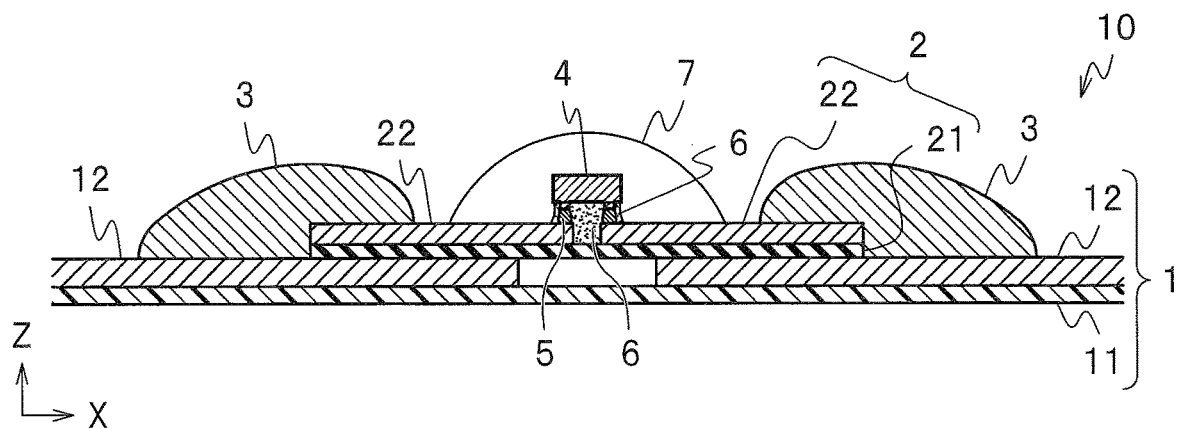
FIG. 2B is an enlarged cross-sectional view taken along line IIB-IIB in FIG. 2A, schematically illustrating the part of the configuration of the light-emitting device according to the embodiment.

A description will be given of the configuration of a light-emitting device according to an embodiment of the present disclosure, with reference to FIGS. 1, 2A, 2B, and 3. FIG. 1 is a perspective view schematically illustrating the configuration of a light-emitting device according to the embodiment. FIG. 2A is an enlarged plan view schematically illustrating a part of the configuration of the light-emitting device according to the embodiment. FIG. 2B is an enlarged cross-sectional view taken along line IIB-IIB in FIG. 2A, schematically illustrating the part of the configuration of the light-emitting device according to the embodiment. FIG. 3 is a plan view schematically illustrating the configuration of a support board of the light-emitting device according to the embodiment.

A light-emitting device 10 has: (i) a support board 1 composed of a flexible first base 11 on which a pattern of first metal films 12 is formed; (ii) connection boards 2 each disposed on an upper surface of the support board 1 and each composed of a second base 21 and second metal films 22 formed thereon; (iii) light-emitting elements 4 respectively mounted on the connection boards 2; and (iv) conductive members 3 each being in contact with corresponding one of the first metal films 12 and corresponding one of the second metal films 22. At least one pair of the first metal films 12 and at least one pair of the second metal films 22 are present. One of the at least one pair of the first metal films 12 is electrically connected with one of the at least one pair of the second metal films 22; and the other of the at least one pair of the first metal films 12 is electrically connected with the other of the at least one pair of the second metal films 22. The light-emitting device 10 further has, for each connection board 2, connection members 5 that connect terminals of the light-emitting element 4 on the connection board 2 to the second metal films 22 of the connection board 2, an underfill material 6 filled between the light-emitting element 4 mounted on the connection board 2 and the connection board 2, and a dome-shaped light-transmissive member 7 disposed on the connection board 2 to cover the light-emitting element 4 mounted on the connection board 2. Incidentally, the light-transmissive members 7 are illustrated in drawings by their contours only. In the present embodiment, the light-emitting device 10 has a rectangular shape in plan view (in XY-axis plane). However, the light-emitting device 10 is not limited thereto and can have various shapes and dimensions according to its application. In the light-emitting device 10, the arrangement pitch of the array of light-emitting elements 4 can be appropriately selected according to the application of the light-emitting device 10. The number of the light-emitting elements 4 is determined on the basis of the arrangement pitch and the dimensions of the light-emitting device 10. In the light-emitting device 10, the arrangement pitch, i.e., a distance between centers of two light-emitting elements 4 adjacent to each other, is preferably 20 mm to 100 mm. For the sake of simplicity, in the light-emitting device 10, twelve light-emitting elements 4 are arranged in a 4×3 array in a square lattice on the XY-axis plane, and the same number of connection boards 2 as the light-emitting elements 4, i.e., twelve connection boards 2, are provided. Hereinafter, a description will be given of the configuration of each member in detail.

Support Board

The support board 1 is a flexible sheet-like wiring board serving as a circuit board that electrically connects light-emitting elements with each other. The support board 1 includes the first base 11 having an upper surface on which a pattern of the first metal films 12 are formed. The first base 11 is a base member that supports the first metal films 12 as well as all the other members of the light-emitting device 10. In the present embodiment, the first base 11 has a rectangular shape in plan view. The first base 11 is made of an insulative material having heat-resistance against heat generated from the light-emitting elements 4 and having heat resistance against a temperature at which the conductive members 3 are to be formed. The temperature at which the conductive members 3 are to be formed is, for example, a curing temperature when the conductive members 3 are conductive adhesive, or a melting temperature when the conductive members 3 are solder. Examples of the material for the first base 11 include polyimide (PI), polyphenylene sulfide, polyethylene terephthalate (PET), polyethylene naphthalate, liquid crystal polymer, polyethylene, polypropylene, glass epoxy resins, and paper. The first base 11 is formed to have such a thickness as to exhibit necessary strength and flexibility, depending on its material. Specifically, the first base 11 preferably has a thickness of 0.01 mm to 1 mm. Preferably, the first base 11 is colored by containing white pigment, such as titanium oxide serving as a light-reflective member, so that the first base 11 can have high surface light reflectance, in particular, high surface diffuse reflectance. With these configurations of the first base 11, the light-emission output of the light-emitting device 10 can be increased.

The first metal films 12 are wiring that electrically connects together the plurality of light-emitting elements 4 mounted on the light-emitting device 10 and electrically connects the plurality of light-emitting elements 4 to an external power source. In the light-emitting device 10, twelve light-emitting elements 4 are connected in series. The first metal films 12 are constituted by first metal films 12a, first metal films $12b_1$, and first metal films $12b_2$. Hereinbelow, the first metal films 12a, $12b_1$, and $12b_2$ may be collectively referred to as "first metal films 12". The first metal films 12 are disposed on the support board 1 so as to make up a serpentine path like a left-right reversed S letter as a whole. The first metal films 12a and the first metal films $12b_1$ are each formed in a straight line shape extending in the X-axis direction and make up three straight line sections of the serpentine path. The first metal films 12 (first metal film 12a and first metal films $12b_1$) making up each straight line section are aligned along the straight line section with gaps therebetween, forming the straight line section in the X-axis direction. The first metal films $12b_2$ are each formed in a C-shape and are each disposed between adjacent two of the straight line sections with gaps therebetween. The connection boards 2 are respectively disposed over those gaps between the first metal films 12. The first metal films 12 are configured to have a thickness and a wiring width such that the first metal films 12 can have necessary conductivity. The more the area of the first metal films 12 is, the easier heat conducted from the light-emitting elements 4 is dissipated to the outside. Thus, it is preferable to configure the first metal films 12 to have a pattern such as to provide sufficient heat dissipation capabilities to the light-emitting device 10. Preferably, each two of the first metal films 12 ($12a$ and $12b_1$; $12b_1$ and $12b_1$; and $12b_1$ and $12b_2$) adjacent in the X-axis direction have a gap with a length less than or equal to the length of corresponding one of the connection boards 2 in the X-axis direction. If such gaps between the first metal films 12 have a shorter length, the first metal films 12 can overlap the second metal films 22 of the connection boards 2 in larger areas in plan view. As a result, heat of the light-emitting elements 4 is easily conducted from the second metal films 22 of the connection boards 2 via the second bases 21 to the first metal films 12, resulting in improved heat dissipation efficiency of the light-emitting device 10.

Preferably, the first metal films 12 are flexible to resist bending because they each have a larger (longer) shape compared to other components such as the connection boards 2, though depending on the arrangement pitch of the light-emitting elements 4. If the first metal films 12 have a large area in total, for example, due to having a large wire width, it is preferable that the first metal films 12 be formed of relatively inexpensive wiring materials. For example, the first metal films 12 are preferably formed of aluminum or an aluminum alloy (hereinafter collectively referred to as "aluminum"), or copper or a copper alloy. Alternatively, the first metal films 12 can be made of silver or the like. Preferably, the first metal films 12 have a thickness such that required conductivity is obtained, anti-breakage (wire-breakage) strength is obtained in combination with the first base 11, and the support board 1 has flexibility as a whole. When the first metal films 12 are made of aluminum, it is preferable that the first metal films 12 be formed to have a thickness of 0.01 mm to 0.2 mm. As described later, the second metal films 22 are also preferably formed of copper or a copper alloy. By forming the first metal films 12 and the second metal films 22 with copper or a copper alloy, it is possible to provide the light-emitting device with good heat dissipation.

Connection Board

The connection boards 2 are respectively provided for the light-emitting elements 4 and serve as boards on which respective light-emitting elements 4 are mounted. Each of the connection boards 2 has a substantially square shape in plan view, but is not limited thereto. The connection board 2 can have a desired shape, such as rectangular, rounded rectangular, or elliptical. The connection board 2 is larger than the light-emitting element 4 mounted thereon in plan view and has regions for connecting with the support board 1 via corresponding ones of the conductive members 3, outside a region where the light-emitting element 4 is mounted. In addition, preferably, the connection board 2 is larger than a region in which the light-transmissive member 7 for the connection board 2 is to be formed, in plan view. The connection boards 2 are each formed to have dimensions in the X-axis and Y-axis directions smaller than the arrangement pitch of the light-emitting elements 4, so that any adjacent connection boards 2 have a gap therebetween. Preferably, the connection boards 2 each have dimensions smaller than or equal to the arrangement pitch at which the plurality of light-emitting elements 4 can be disposed and mounted (bonded and sealed) with high work efficiency. Specifically, each connection board 2 preferably has an area of 1 $mm^2$ to 400 $mm^2$ (corresponding to 1 mm square to 20 mm square). The connection board 2 has the second base 21 having an upper surface on which two second metal films 22 are patterned and formed with a gap therebetween. These two second metal films 22 serves as a pair of electrodes when electrically connected with an external power source.

The second base 21 is a base member that supports the two separate second metal films 22 without short-circuiting them and is made of an insulative material with heat resistance like the first base 11. The material for the second base 21 can be selected from the above-described examples of the material for the first base 11 and having the above-described heat resistances, and can be the same material as the first base 11. The second base 21 is formed to have a thickness such as not to be broken in a process for manufacturing a light-emitting device 10, e.g., in a process step of mounting a light-emitting element 4. Meanwhile, it is preferable that the second base 21 have a small thickness so that heat is easily conducted from the second metal films 22 formed on the upper surface of the second base 21 to the first metal films 12 located under the second base 21. Preferably, the second base 21 is flexible like the support board 1, to impart flexibility to the connection board 2. Specifically, the second base 21 is preferably formed to have a thickness of 0.01 mm to 0.3 mm. As the connection board 2 is flexible, the connection board 2 easily deforms following the support board 1, and thus hardly peels off from the support board 1. In addition, as both the support board 1 and the connection boards 2 are flexible, they are not likely to be broken and the light-emitting device 10 can be easily bent and deformed. In addition, the light-emitting device 10 can be transported or stored in a rolled form, which facilitates storage and management of the light-emitting device 10.

The second metal films 22 of each connection board 2 serve as electrodes to which a light-emitting element 4 capable of being mounted by flip-chip mounting is directly bonded. The second metal films 22 are disposed on the connection board 2 so as to be spaced apart from each other according to the arrangement of terminals of the light-emitting element 4. In the second metal films 22, notches $22n$ are formed for the purpose of identifying polarities of the light-emitting element 4 mounted on the connection board 2. The notches $22n$ are formed such that one of the second metal films 22 and the other have different appearances. For example, one of sides of the second metal films 22 facing with each other has two corners each having a notch with a quarter arc shape in plan view. The second metal films 22 also serve as heat dissipation members that dissipate heat generated from the light-emitting element 4 to the outside thereof, and thus are preferably formed of a wiring material having high heat conductivity in addition to high electrical conductivity. Preferably, the second metal films 22 have a lower thermal resistance value than the first metal films 12. The thermal resistance value can be adjusted by selecting the thickness and/or the material of the second metal films 22. Configuring the second metal films 22 to have a low thermal resistance value improves the heat dissipation of the light-emitting device 10. Preferably, the second metal films 22 are formed of copper or a copper alloy (hereinafter collectively referred to as "copper"). Preferably, the second metal films 22 have a thickness such that required electrical conductivity is obtained, anti-breakage strength is obtained in combination with the second base 21, and the connection board 2 has flexibility as a whole. When the second metal films 22 are made of copper, it is preferable that the second metal films 22 be formed to have a thickness of 0.01 mm to 0.1 mm.

Conductive Member

The conductive members 3 electrically connect the light-emitting elements 4 mounted on the connection boards 2 to the first metal films 12 of the support board 1. The conductive members 3 are each formed per each second metal film 22 so as to be in contact with the second metal film 22 and with corresponding one of the first metal films 12. That is, for each connection board 2, at least two conductive members 3 are formed, such that each of the two conductive members 3 extends from the connection board 2 (second metal film 22) across a center portion of corresponding one of outer opposite sides of the connection board 2 facing in the X-axis direction, and is connected to an upper surface of the corresponding first metal film 12. The conductive members 3 conduct heat of the light-emitting elements 4 from the second metal films 22 to the first metal films 12 to discharge the heat to the outside. The conductive members 3 also serve as adhesive materials that fix the connection boards 2 onto the support board 1. Preferably, the conductive members 3 are made of flexible conductive paste. Use of flexible conductive paste allows the light-emitting device 10 to have flexibility. Alternatively, the conductive members 3 can preferably be solder. Use of solder allows for establishing electrical connections and bonding between the connection boards 2 and the support board 1 at a relatively low temperature. In addition, the bonded connection boards 2 can be easily detached from the support board 1 without breaking the first metal films 12. Thus, for example, when initial failures of some light-emitting elements 4 or deterioration of some connection boards 2 is detected, the light-emitting elements 4 or the connection boards 2 can be easily exchanged on a connection board 2 basis.

Each conductive member 3 is formed to be in contact with corresponding one of the first metal films 12 and with corresponding one of the second metal films 22 in respective regions each having an enough area to obtain necessary conductivity and bonding strength. Meanwhile, the conductive members 3 each preferably have certain dimensions (length and thickness) so as not to peel off when the light-emitting device 10 deforms due to its flexibility. Preferably, the conductive members 3 are disposed so as not to be in contact with the light-emitting elements 4. In the present embodiment, the conductive members 3 for each connection board 2 are disposed outside the light-transmissive member 7 that seals the light-emitting element 4 mounted on the connection board 2, with gaps therebetween. With this structure, even when the conductive members 3 are heated to a high temperature by heat transferred from the light-emitting element 4, deterioration of the characteristics of the light-emitting element 4 can be prevented. In particular when the conductive members 3 are made of a material with low flexibility, it is preferable that the conductive members 3 be disposed spaced apart from the light-transmissive member 7. With this structure, even when individual parts are hardly deformed, the light-emitting device 10 is not prevented from being deformed as a whole.

Light-Emitting Element

In the present embodiment, each of the light-emitting elements 4 is a chip of semiconductor light-emitting element that is capable of being mounted by flip-chip mounting (face-down mounting) by having a lower surface as a mounting surface with a pair of terminals (pad electrodes). The pair of terminals of the light-emitting element 4 does not overlap with each other when viewed in the Y-axis direction and is spaced from each other in the X-axis direction. The light-emitting element 4 has a substantially square shape in plan view, but it is not limited to specific shape or size. The light-emitting element 4 is not particularly limited as to the emission color. It is possible to select a light-emitting element that emits light having an appropriate wavelength according to the application of the light-emitting device 10, such as a blue light-emitting element having an emission peak in the wavelength range of 430 nm to 470 nm. Examples of such a blue light-emitting element include an InGaN-based nitride semiconductor represented by $In_XAl_YGa_{1-X-Y}N$ ($0 \leq X \leq 1$, $0 \leq Y \leq 1$, $X+Y<1$).

Connection Member

The connection members 5 are conductive bodies that bond the terminals of the light-emitting element 4 of each connection board 2 to the second metal films 22 thereof to make an electrical connection therebetween. Preferably, the connection members 5 are made of a material that allows for mounting (bonding) the light-emitting element 4 to a soft, flexible connection board 2 with a low bonding load. Solder and conductive adhesive, which have been exemplified as the material for the conductive members 3, can be used for the connection members 5.

Underfill Material

Each underfill material 6 is made of an insulative material, is disposed under the light-emitting element 4 mounted on each connection board 2, and is filled between the light-emitting element 4 and the connection board 2 so as to reinforce the bonding of the light-emitting element 4 to the connection board 2 by the connection member 5. The underfill material 6 is disposed as needed. The underfill material 6 is formed of a thermosetting resin such as an epoxy resin or a silicone resin. Later-described materials for the light-transmissive members 7 can be used for the underfill material 6. Preferably, the underfill material 6 is added with a light-reflective material such as titanium oxide, in which case the underfill material 6 reflects light emitted downwardly from the light-emitting element 4 in an upward direction to increase the light-extraction efficiency of the light-emitting device 10.

Light-Transmissive Member

The light-transmissive member 7 is a sealing member for covering the light-emitting element 4 on each connection board 2 to protect the light-emitting element 4 from dust and moisture. In the present embodiment, the light-transmissive member 7 is formed in a dome shape to be an optical member serving as a lens for spreading and emitting light from the light-emitting element 4. The light-transmissive member 7 is formed of a transparent thermosetting resin such as an epoxy resin or a silicone resin, in which a phosphor or light-reflective material can be dispersed as necessary.

Method of Manufacturing Light-Emitting Device

Figure 4:
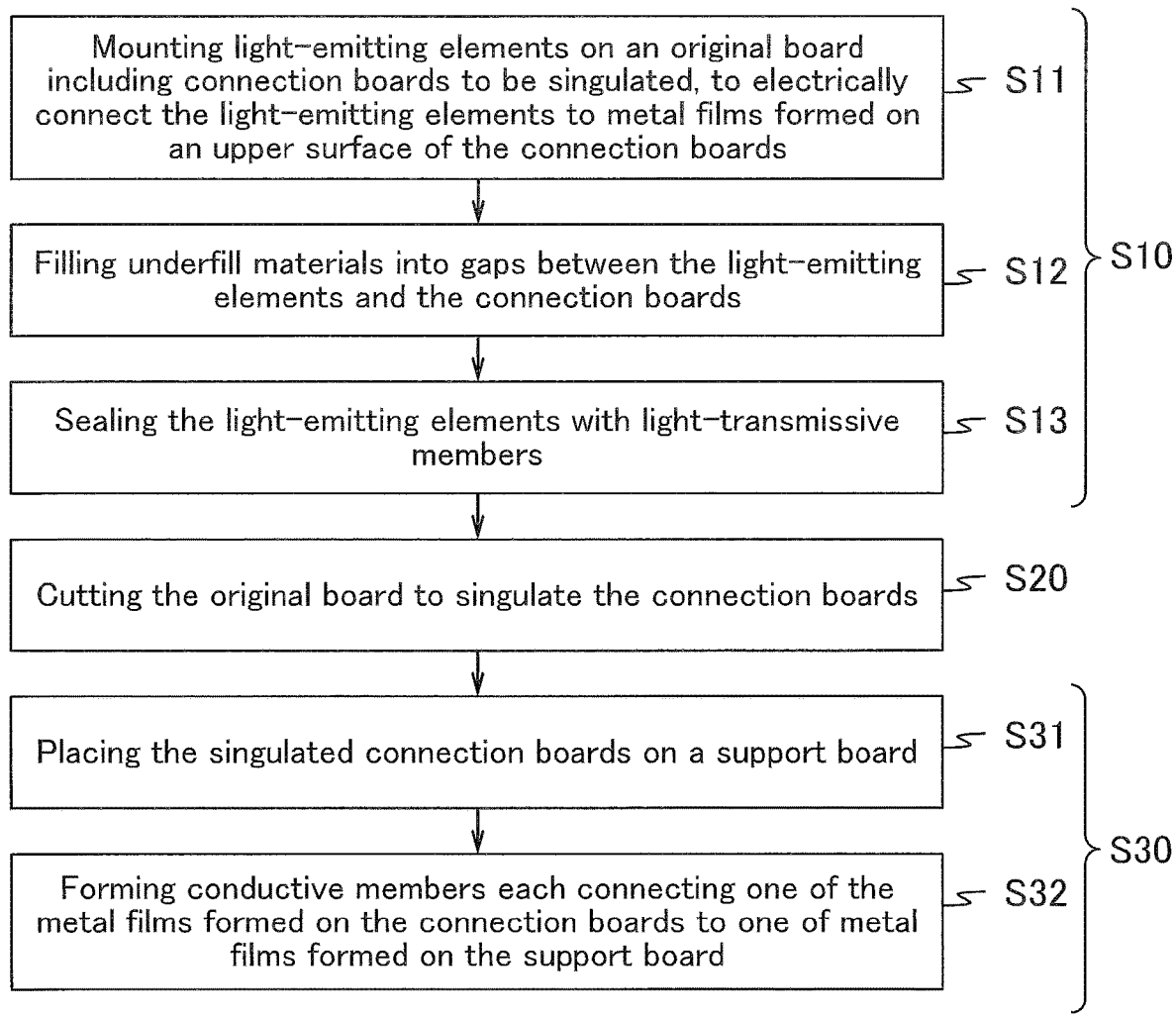
FIG. 4 is a flowchart illustrating a method for manufacturing the light-emitting device according to the embodiment.
Figure 5:
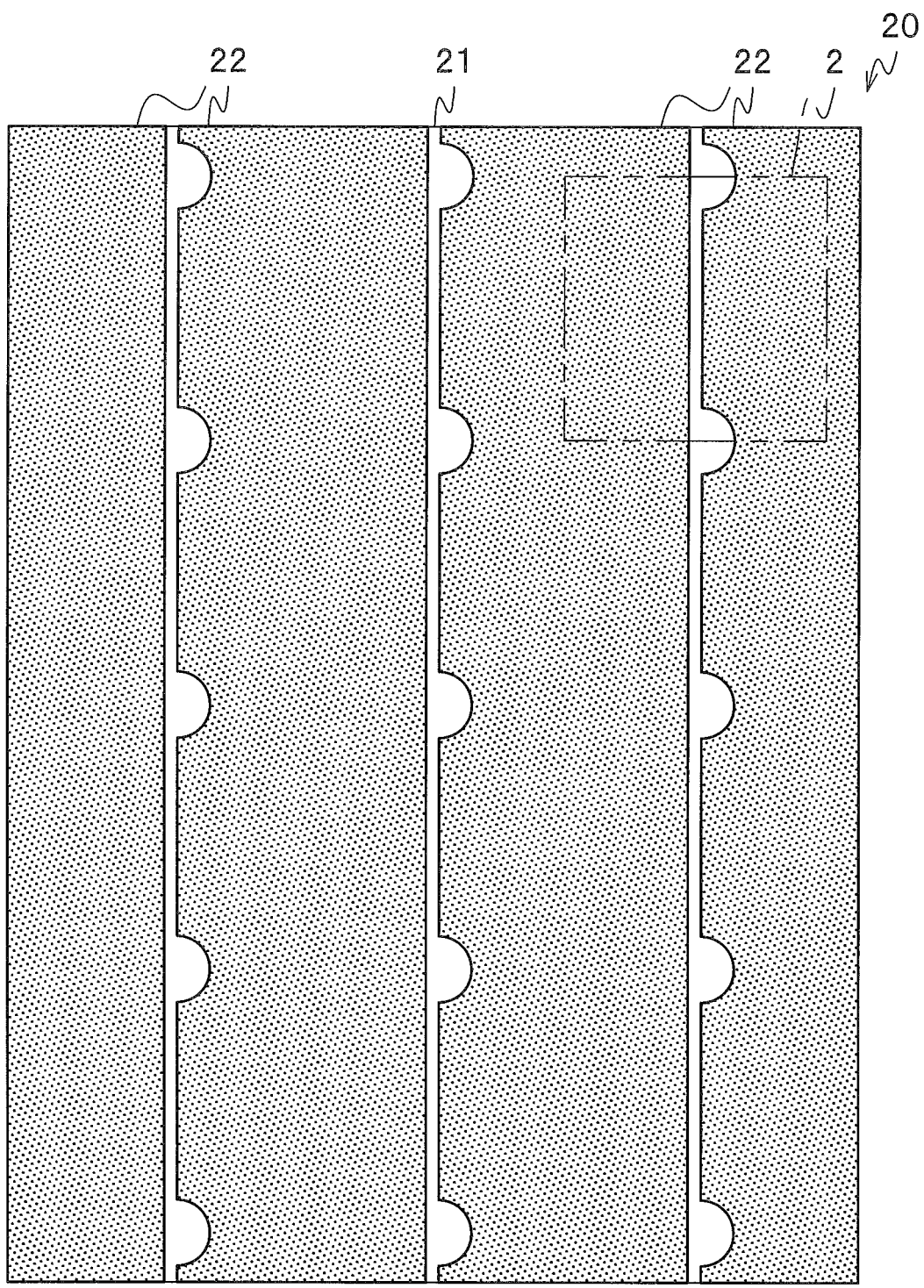
FIG. 5 is a plan view schematically illustrating the configuration of an original board for connection boards of the light-emitting device according to the embodiment.
Figure 6A:
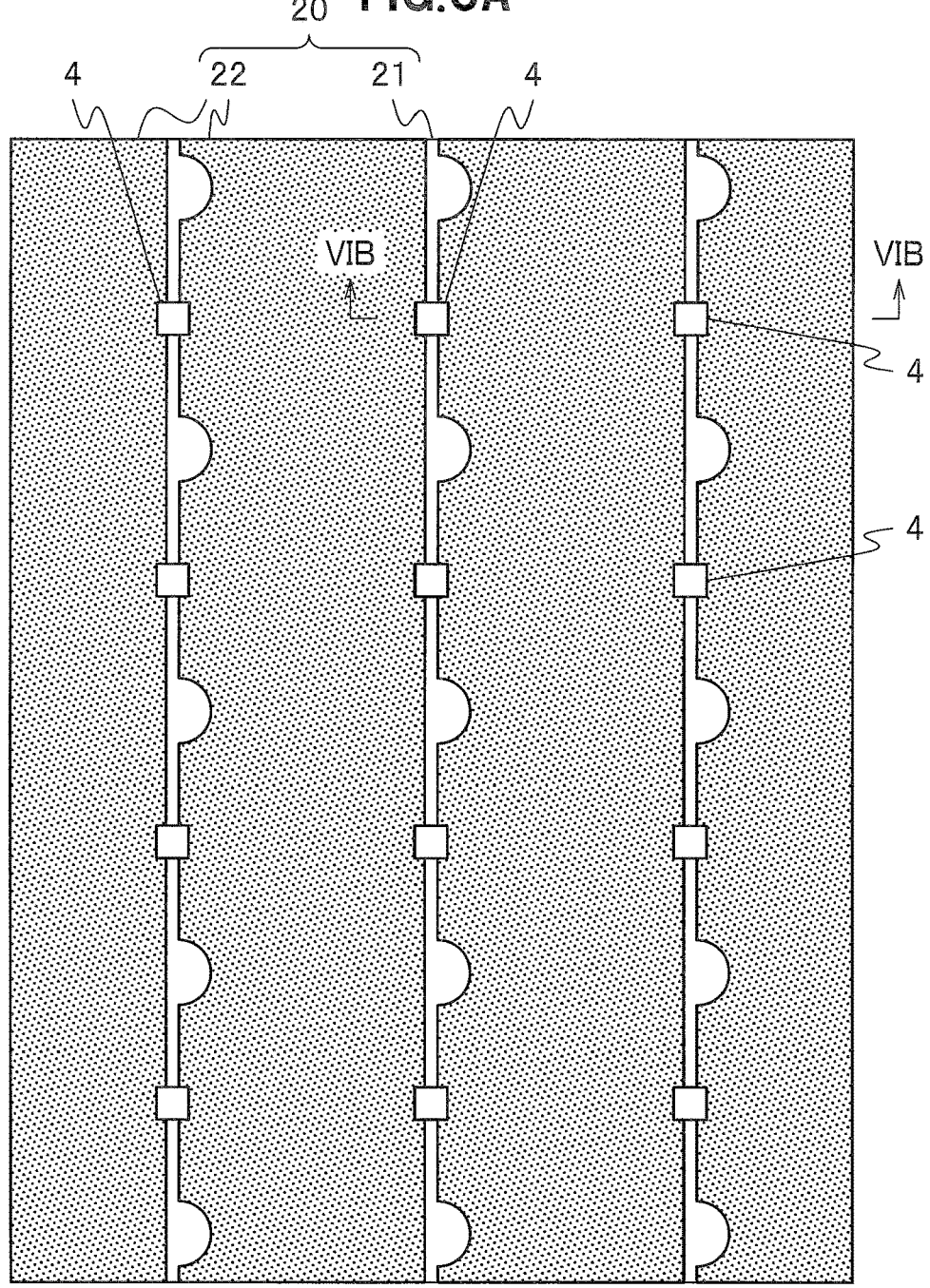
FIG. 6A is a plan view schematically illustrating the configuration of the original board for the connection boards in a bonding step which is carried out in a light-emitting element mounting step of the method for manufacturing the light-emitting device according to the embodiment.
Figure 6B:
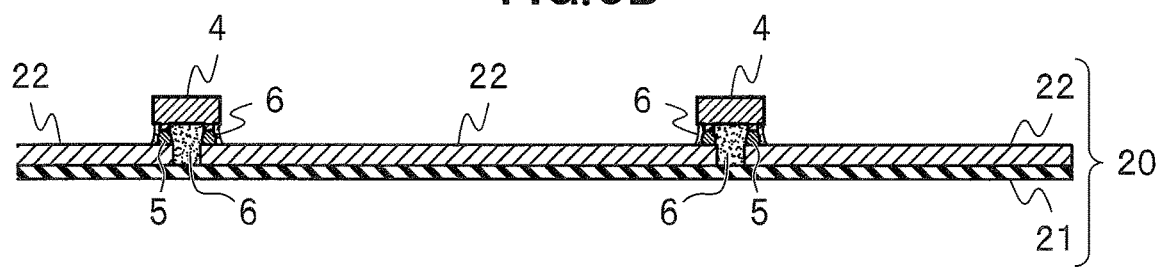
FIG. 6B is an enlarged cross-sectional view taken along line VIB-VIB in FIG. 6A, schematically illustrating a part of the original board for the connection boards in the bonding step and an underfilling step which are carried out in the light-emitting element mounting step of the method for manufacturing the light-emitting device according to the embodiment.
Figure 7:
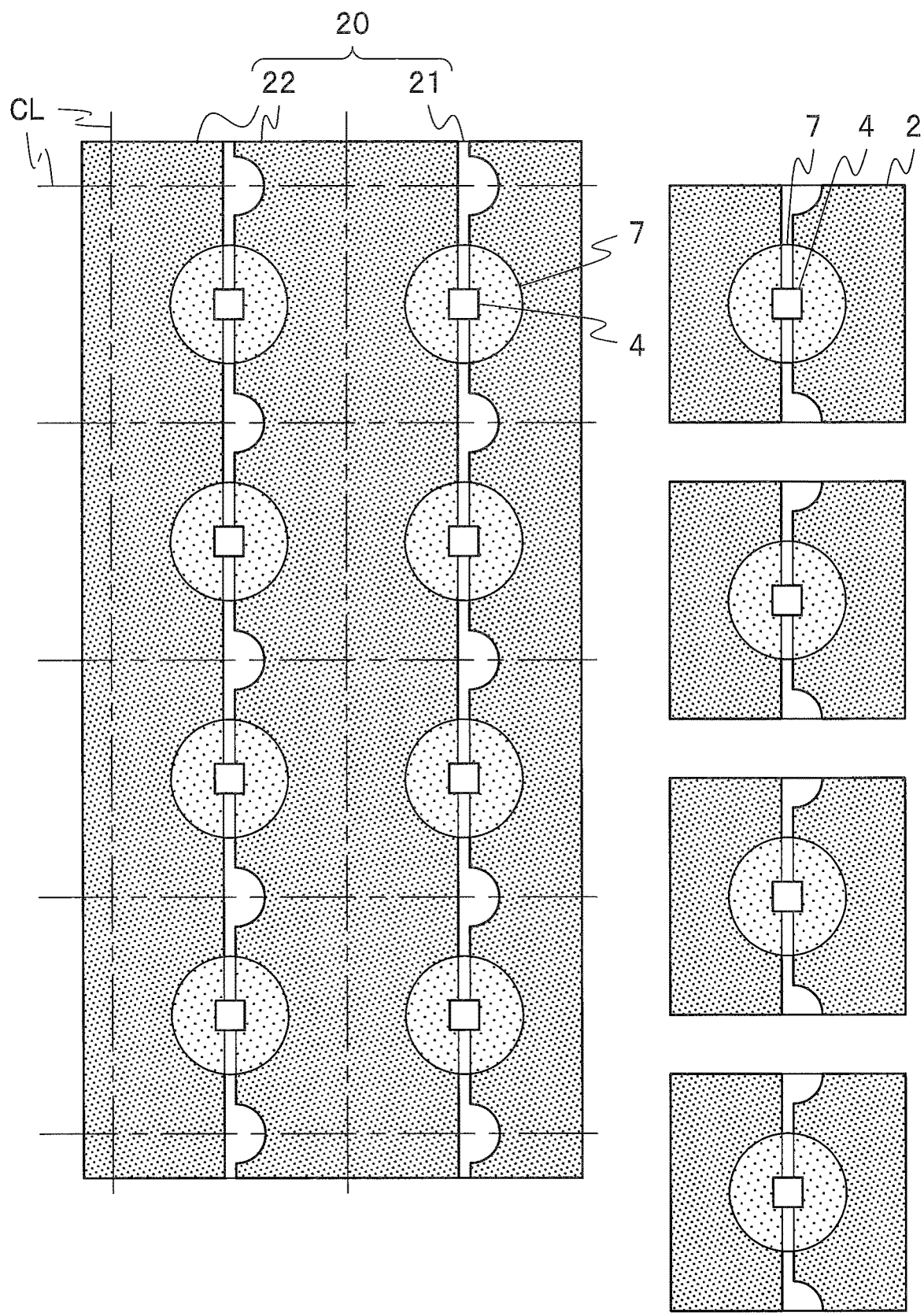
FIG. 7 is a plan view schematically illustrating the connection boards and the original board thereof in a singulation step of the method for manufacturing the light-emitting device according to the embodiment.

A description will be given of a method of manufacturing the light-emitting device according to the present embodiment, with reference to FIGS. 4, 5, 6A, and 6B, and further with reference to FIGS. 1, 2A, 2B, and 3. FIG. 4 is a flowchart illustrating the method for manufacturing the light-emitting device according to the embodiment. FIG. 5 is a plan view schematically illustrating the configuration of an original board for connection boards of the light-emitting device according to the embodiment. FIG. 6A is a plan view schematically illustrating the configuration of the original board for the connection boards in a bonding step which is carried out in a light-emitting element mounting step of the method for manufacturing the light-emitting device according to the embodiment. FIG. 6B is an enlarged cross-sectional view taken along line VIB-VIB in FIG. 6A, schematically illustrating a part of the original board for the connection boards in the bonding step and an underfilling step which are carried out in the light-emitting element mounting step of the method for manufacturing the light-emitting device according to the embodiment. FIG. 7 is a plan view schematically illustrating the connection boards and the original board thereof in a singulation step of the method for manufacturing the light-emitting device according to the embodiment.

The method of manufacturing a light-emitting device according to the present embodiment includes: a singulation step S20 in which an original board having a layer for second bases 21, a pattern of second metal films 22 formed on the layer for second bases 21, and a plurality of light-emitting elements 4 mounted on the pattern of second metal films 22 is cut to produce a plurality of connection boards 2 on which the plurality of light-emitting elements 4 are respectively mounted; and a connection board mounting step S30 in which the plurality of connection boards 2 are placed to be spaced apart from each other on a support board 1 having a flexible first base 11 on which a pattern of first metal films 12 is formed, and conductive members 3 are formed such that each of the conductive members 3 is in contact with corresponding one of the first metal films 12 and corresponding one of the second metal films 22. The method of manufacturing a light-emitting device according to the present embodiment further includes: a light-emitting element mounting step S10 including a light-transmissive member forming step S13. The light-emitting element mounting step S10 is to be conducted before the singulation step S20. Hereinafter, each step if described in detail.

Light-Emitting Element Mounting Step

The light-emitting element mounting step S10 mounts light-emitting elements 4 on an original board 20, from which connection boards 2 have not been singulated yet. The light-emitting element mounting step S10 performs: a bonding step S11, an underfill step S12, and a light-transmissive member forming step S13, in this order. First, a description will be given of the configuration of the original board 20.

The original board 20 is formed to have such dimensions as to include a plurality of connection boards 2. Then, light-emitting elements 4 are mounted on the original board 20. Then, the original board 20 is cut in the singulation step S20 into a plurality of connection boards 2 on which the light-emitting elements 4 are respectively mounted. The original board 20 has a layer for second bases 21 and a pattern of second metal films 22 formed on the layer for second bases 21, to include the plurality of connection boards 2. For the sake of simplicity, it is assumed that the original board 20 has such dimensions as to include twelve connection boards 2 in an array of 3×4. In FIG. 5, the alternate long and short dash line represents one connection board 2. The more the number of the connection boards 2 obtained per original board 20 (the more the number of the light-emitting elements 4 mounted on the original board 20), the production time per light-emitting device 10 can be decreased. The original board 20 has a metal film formed thereon to be processed into a plurality of second metal films 22. The metal film is processed to have slits as well as notches located on the right side of each slit and each having a substantially half arc shape. The slits are formed at intervals equal to a lateral length (X-axis direction length in FIG. 2A) of each connection board 2, in the left-right direction in FIG. 5. The half-arc-shaped notches are formed at intervals equal to a longitudinal length (Y-axis direction length in FIG. 2A) of each connection board 2, in the top-bottom direction in FIG. 5.

As an example, the original board 20 may be fabricated by affixing a metal foil such as a copper foil on one side of the layer for second bases 21, and removing portions of the metal foil corresponding to the slits and notches by photolithography and etching, to make a pattern of second metal films 22. The metal foil can be affixed onto the layer for second bases 21 with an adhesive having heat resistance like the layer for second bases 21. Alternatively, in a case where the layer for second bases 21 is made of a liquid crystal polymer or the like, the metal foil can be affixed onto the layer for second bases 21 by thermal compression or the like.

The bonding step S11 mounts the light-emitting elements 4 at predetermined positions on the original board 20 by flip-chip mounting. Here, the predetermined positions correspond to centers of the connection boards 2 in plan view, at each of which one of the light-emitting elements 4 is disposed across one of the slits of the pattern of second metal films 22. In this way, in each connection board 2, the terminals of the light-emitting element 4 are respectively bonded to the second metal films 22 spaced apart from each other in the left-right direction on the connection board 2. As the original board 20 is configured to include twelve connection boards 2, twelve light-emitting elements 4 are mounted.

The underfill step S12 fills an underfill material 6 into a gap between each light-emitting element 4 and the original board 20. In this step, a thermosetting resin in a liquid state, which is to constitute the underfill material 6, is applied to a periphery of each light-emitting element 4 on the original board 20, to be permeated into the gap by capillary phenomenon. Then, the thermosetting resin is heated to be hardened, for use as the underfill material 6.

The light-transmissive member forming step S13 forms light-transmissive members 7 that respectively cover the light-emitting elements 4. In the present embodiment, a thermosetting resin in a liquid state, which is to constitute the light-transmissive members 7, is molded using a mold to form the light-transmissive members 7 each in a dome shape. Alternatively, a resin material with high viscosity can be dropped (by potting) from above each light-emitting element 4, to dispose the resin material in a raised shape. Thereafter, the resin material is heated to be hardened, for use as the light-transmissive members 7.

Singulation Step

In the singulation step S20, the original board 20, on which the plurality of light-emitting elements 4 are mounted, is cut along cutting lines CL represented by the alternate long and short dash lines shown in FIG. 7, to get a plurality of connection boards 2 on which the plurality of light-emitting elements 4 is respectively mounted. Cutting with a cutter or laser or punching using a blade mold such as a Thomson blade can be employed to singulate the connection boards 2 from the original board 20. As the cutting lines CL extend across the half arc shaped notches formed on the second metal films 22, the singulated connection boards 2 each have two second metal films 22 one of which has quarter arc shaped notches 22n.

Connection Board Mounting Step

The connection board mounting step S30 arranges and mounts the connection boards 2, on which the light-emitting elements 4 are mounted, on a support board 1. The connection board mounting step S30 performs a connection board arrangement step S31 and a conductive member forming step S32 in this order, to complete manufacturing a light-emitting device 10. First, a description will be given of a method for fabricating the support board 1.

As an example, like the original board 20, the support board 1 can be fabricated by affixing a metal foil, such as an aluminum foil or a copper foil, onto one side of a first base 11 with an adhesive or by thermal compression, and then forming a pattern of first metal films 12 by photolithography and etching. Alternatively, a metal foil can be cut into the pattern of the first metal films 12 and the pattern of the first metal films 12 is affixed on the first base 11 at a predetermined position. Alternatively, the pattern of the first metal films 12 can be formed by printing the shape of the pattern on one side of the first base 11 with a conductive ink, such as silver ink or copper ink. When the area of the first metal films 12 is not so large compared to that of the support board 1, the support board 1 can be fabricated at lower cost by (a) affixing a metal foil cut out into the pattern of the first metal films 12 onto the first base 11 or by (b) forming the first metal films 12 by directly printing conductive ink on the first base 11, rather than by affixing a metal foil onto whole of one side of the first base 11 and removing unnecessary portions of the metal foil by etching. In particular, the above described methods (a) and (b) are efficient when using relatively expensive wiring material such as copper for the first metal film 12.

The connection board arrangement step S31 places the connection boards 2, on which the light-emitting elements 4 are mounted, at predetermined positions on the support board 1 in predetermined orientations. In the light-emitting device 10, as the light-emitting elements 4 are connected in series in serpentine-shaped wiring made up by the first metal films 12, connection boards 2 on an odd number row and connection boards 2 on an even number row are arranged so as to be oriented in an opposite direction at an angle of 180°.

The conductive member forming step S32 forms, for each connection board 2, conductive members 3 each being in contact with corresponding one of the second metal films 22 on the connection board 2 and with corresponding one of the first metal films 12 on an upper surface of the support board 1, to make an electrical connection therebetween and fix the connection board 2 at a predetermined position on the support board 1. The conductive members 3 can be formed by a method suitable to the material thereof.

The series of steps S31 to S32 of the connection board mounting step S30 can be performed such that each of the steps is performed on all of the twelve connection boards 2 of the light-emitting device 10 before the next step is performed, or such that the steps are performed in order per each of the connection boards 2 or per each row of the connection boards 2.

The series of steps S11 to S13 of the light-emitting element mounting step S10 are performed at the arrangement pitch of the light-emitting elements 4 arranged on the original board 20, i.e., at intervals corresponding to the length of a side of each connection board 2. Therefore, in the bonding step S11 for example, when one light-emitting element 4 has been mounted on the original board 20 and the next light-emitting element 4 is to be mounted on an adjacent portion, the distance by which the original board 20 or a picked-up light-emitting element 4 has to be moved is short. Accordingly, time for movement is reduced. Moreover, the light-emitting elements 4 are mounted on the original board 20 with all the light-emitting elements 4 being oriented in the same direction, irrespective of the orientations of the light-emitting elements 4 in the light-emitting device 10. Thus, before mounting a light-emitting element 4 next in the bonding step S11, there is no need for rotating the light-emitting element 4 or the original board 20. In the light-transmissive member forming step S13, when the light-transmissive members 7 are molded using a mold, it is preferable to use one mold having a plurality of recesses in accordance with the arrangement of the light-emitting elements 4. As the size of a mold is limited by the resin-molding apparatus or the like, mounting the light-emitting elements 4 on the original board 20 at a narrow pitch facilitates forming light-transmissive members 7 for a large number of the light-emitting elements 4 at the same time. When using a furnace to cure a thermosetting resin in the light-transmissive member forming step S13 or the like, a processing amount available per one operation of curing is limited by the area of a board (original board 20) on which light-emitting elements 4 are mounted rather than by the number of the light-emitting elements 4. Therefore, mounting the light-emitting elements 4 on the original board 20 at a narrow pitch facilitates processing a large number of light-emitting elements 4 at the same time. As a result of these, the total processing time per light-emitting element 4 can be reduced.

Note that, in the connection board mounting step S30, although the arrangement pitch of the connection boards 2 is large, the step does not require such a high alignment accuracy as one required in the light-emitting element mounting step S10. Thus, the support board 1 or the connection boards 2 can be transported at a high speed to reduce time required for mounting the connection boards 2. Moreover, in the conductive member forming step S32, a certain margin of error is allowed in the positions where the conductive members 3 are to be formed. Moreover, in the connection board arrangement step S31, as the positions of the connection boards 2 can be adjusted on the basis of the positions of the light-emitting elements 4 and/or the light-transmissive members 7, the connection board arrangement step S31 can be easily adapted to configure changes made to the support board 1. Moreover, as the light-emitting elements 4 are not directly mounted on the support board 1, the formation of the pattern shape of the first metal films 12 does not demand high dimensional accuracy, and allows for selection of a low-cost configuration and a low-cost manufacturing method.

Modifications

First Modification

Figure 8B:
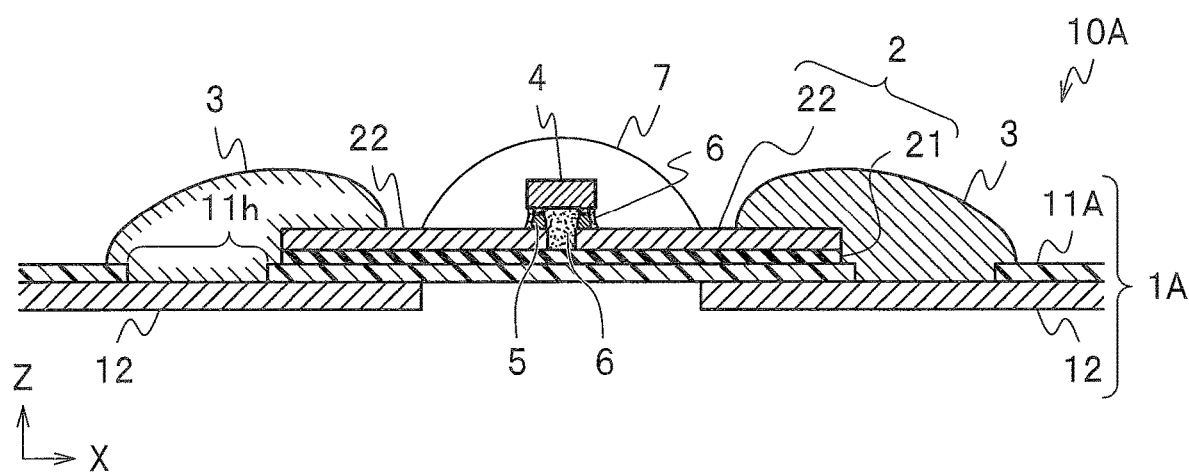
FIG. 8B is an enlarged cross-sectional view taken along line VIIIB-VIIIB in FIG. 8A, schematically illustrating part of the configuration of the light-emitting device according to the first modification of the embodiment.
Figure 9A:
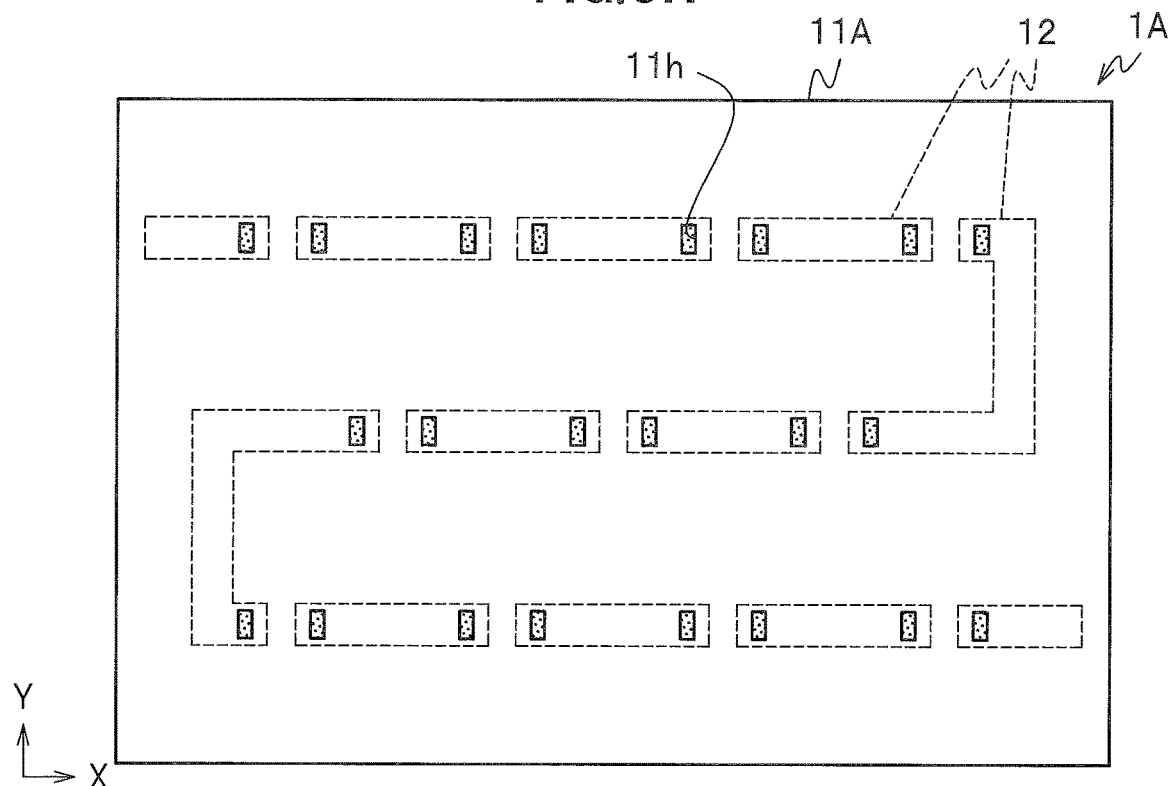
FIG. 9A is a plan view schematically illustrating the configuration of a support board of the light-emitting device according to the first modification of the embodiment.
Figure 9B:
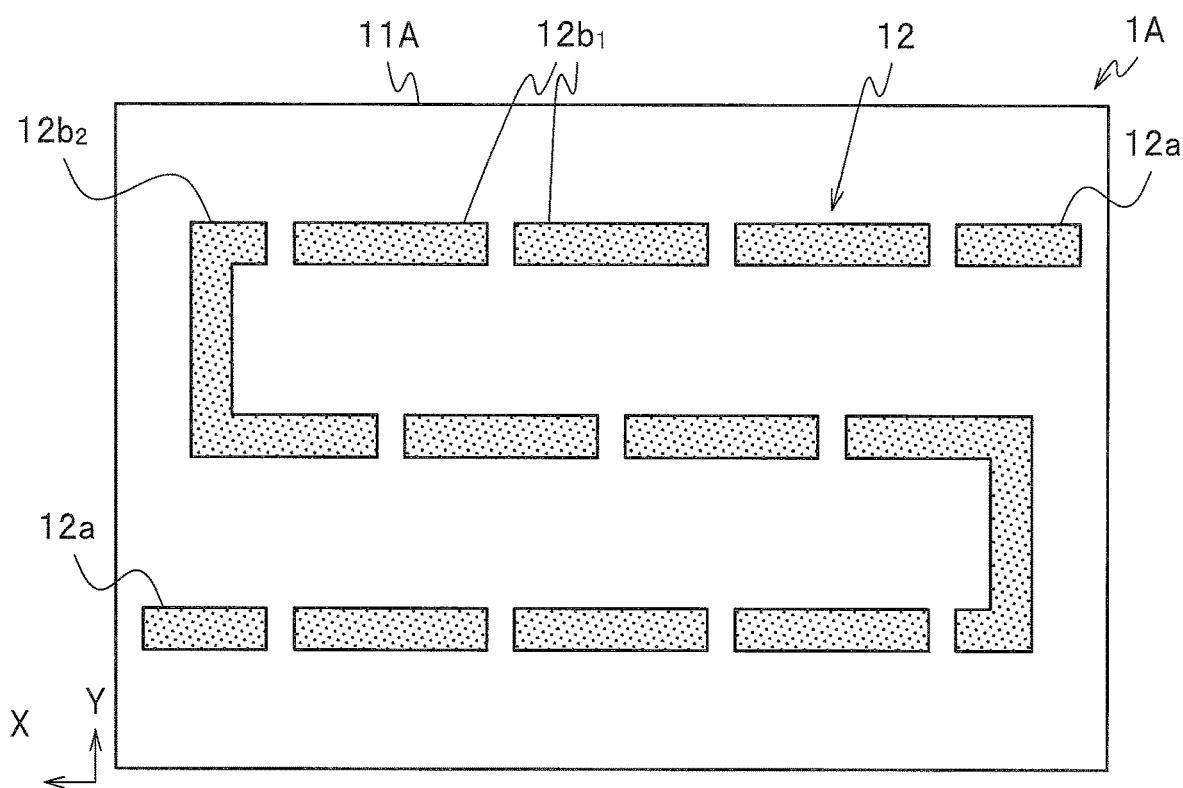
FIG. 9B is a bottom view schematically illustrating the configuration of the support board of the light-emitting device according to the first modification of the embodiment.

The light-emitting device according to the embodiment can be modified so as not to expose the first metal films 12 to the plane from which light is emitted. Hereinafter, a description will be given of the configuration of a light-emitting device according to a first modification of the embodiment, with reference to FIGS. 8A, 8B, 9A, and 9B. FIG. 8A is a perspective view schematically illustrating the configuration of a light-emitting device according to the first modification of the embodiment. FIG. 8B is an enlarged cross-sectional view taken along line VIIIB-VIIIB in FIG. 8A, schematically illustrating part of the configuration of the light-emitting device according to the first modification of the embodiment. FIG. 9A is a plan view schematically illustrating the configuration of a support board of the light-emitting device according to the first modification of the embodiment. FIG. 9B is a bottom view schematically illustrating the configuration of the support board of the light-emitting device according to the first modification of the embodiment.

A light-emitting device 10A according to the first modification has: (i) a support board 1A composed of a flexible first base 11A with a lower surface on which first metal films 12 are formed: (ii) connection boards 2 each disposed on an upper surface of the support board 1A and each composed of a second base 21 and second metal films 22 formed thereon; (iii) light-emitting elements 4 respectively mounted on the connection boards 2; and (iv) conductive members 3 each being in contact with one of the second metal films 22 of corresponding one of the connection boards 2 and with corresponding one of the first metal films 12 that is exposed through one of holes 11h formed in the first base 11A. The light-emitting device 10A further has, for each connection board 2, connection members 5 that connects terminals of the light-emitting element 4 on the connection board 2 respectively to the second metal films 22 formed on the connection board 2, an underfill material 6 filled between the light-emitting element 4 mounted on the connection board 2 and the connection board 2, and a dome-shaped light-transmissive member 7 disposed on the connection board 2 to cover the light-emitting element 4 mounted on the connection board 2. The light-emitting device 10A has a rectangular shape in plan view. The light-emitting device 10A is provided with eleven light-emitting elements 4 arranged in a staggered fashion with 4, 3, 4 pieces per each row, and is provided with the same number of the connection boards 2 as the light-emitting elements 4. The light-emitting device 10A has the same configuration as the light-emitting device 10 according to the embodiment, except the configuration of the support board 1A as well as the number and arrangement of the light-emitting elements 4 and the connection boards 2. The light-emitting device 10A can be manufactured by a method similar to that of the light-emitting device 10. Hereinafter, configurations of parts that differ from those of the above-described embodiment are described in detail.

The support board 1A is a flexible, sheet-like wiring board composed of the first base 11A having a lower surface on which a pattern of first metal films 12 ($12a$, $12b_1$, $12b_2$) is formed. In the support board 1A, the first base 11A has pairs of rectangular holes $11h$ each spaced apart from each other in the X-axis direction across a region where one of the connection boards 2 is disposed. Other configurations of the first base 11A are the same as that of the first base 11 of the light-emitting device 10. The first metal films 12 are formed in a pattern in accordance with the arrangement of the light-emitting elements 4 similarly to those in the above-described embodiment, except that they are formed on the back (lower) surface of the first base 11A.

The holes $11h$ in the first base 11A penetrate the first base 11A to allow for connecting the conductive members 3 formed on an upper side of the support board 1A to the first metal films 12. For that purpose, the holes $11h$ are formed at positions respectively corresponding to regions where the conductive members 3 are formed in the support board 1A, such that the area of the holes $11h$ is enough to allow for providing necessary conductivity between the conductive members 3 and the first metal films 12. In the support board 1A, the first metal films 12 are patterned to correspond to the holes $11h$ of the first base 11A, such that: the first metal films 12 entirely cover the holes $11h$; the first metal films 12 are exposed through the holes $11h$, over the whole area of each hole $11h$ in plan view (as seen from above); and the entire periphery of each hole $11h$ is bonded to a corresponding first metal film 12 on the back surface of the first base 11A. Preferably, portions of the first metal films 12 that correspond to the holes $11h$ of the first base 11A are formed to have a strength enough to be self-supporting. In the present modification, each hole $11h$ of the first base 11A has a longer length along the Y-axis direction than the corresponding conductive member 3 and extends past the corresponding conductive member 3 in both the positive and negative directions of the Y-axis, so that the corresponding first metal film 12 is partially exposed through the hole $11h$. However, the conductive members 3 can be formed such as to be each filled in the whole of the corresponding hole $11h$. The support board 1A is manufactured by affixing metal foils onto the back surface of the first base 11A in which the holes $11h$ have been formed. The light-emitting device 10A has a light-emitting side covered by the first base 11A except regions where the connection boards 2 are disposed and the vicinities of the regions. Therefore, the light-emission output of the light-emitting device 10A can be improved by adopting a material with a high diffuse reflectance for the first base 11A.

The above-described light-emitting devices 10 and 10A can have the following configurations. In either of the light-emitting devices 10 and 10A, connection boards 2 (second base 21) can be fixed not only through the conductive members 3, but also by bonding back surfaces of the connection boards 2 (second bases 21) to a front surface of the support board 1 or 1A. The bonding can be by use of an adhesive or a double-sided tape. A conductive adhesive can be applied to each of the first metal films 12 on the support boards 1 or 1A, such that the first metal films 12 are not short-circuited. The conductive adhesive can be made of the same material as the conductive members 3. Alternatively, the bonding can be by affixing by thermal compression depending on the material of the second base 21 and the first base 11 or 11A. The bonding is to be carried out in the connection board arrangement step S31. As the back surfaces of the connection boards 2 are bonded to the support board 1 or 1A, the conductive members 3 are not likely to peel off even when the light-emitting device 10 or 10A deforms, which improves the reliability of the light-emitting device 10 or 10A. As the second bases 21 of the connection boards 2 adhere closely to the support board 1, heat of the light-emitting elements 4 is likely to propagate via the second metal films 22 and the second bases 21 to the first metal films 12, which improves heat dissipation properties of the light-emitting device 10 or 10A.

In the light-emitting devices 10 and 10A, in each connection board 2, the conductive members 3 for the connection board 2 are respectively formed in the vicinities of center portions of opposing sides of the connection board 2, in one area for each of the opposing sides. However, the conductive members 3 can be formed in two or more areas for each of the opposing sides. When the conductive members 3 are provided in two or more areas for each of the opposing sides, the size of the conductive member 3 in one area can be kept small while ensuring a contact area. The connection boards 2 can each be configured to have a rectangular shape not significantly larger than the light-transmissive member 7 disposed on the connection board 2 and having a circular shape in plan view, and a total of four conductive members 3 can be formed at corners of the connection board 2.

The size of each connection board 2 mounted on the light-emitting devices 10 and 10A is not limited to the arrangement pitch of the light-emitting elements 4 in the original board 20. The connection boards 2 can be formed in a shape with dimensions smaller than the arrangement pitch in plan view. The shape or the like of each connection board 2 is not limited to be configured to have the notches $22n$ of the second metal films 22 of the connection board 2, so long as the polarity of the light-emitting element 4 mounted on the connection board 2 is identified on the basis of the shape. For example, the connection board 2 can be of a rectangular shape with one corner cut off obliquely. Alternatively, connection boards 2 need not have the notches $22n$ or the like, if the polarity of the light-emitting element 4 mounted on each connection board 2 is identified without using the notches $22n$. This can be done, for example, by carrying out the connection board mounting step S30 consecutively after the singulation step S20. The pattern shape of the pair of second metal films 22 formed on each connection board 2 and spaced apart from each other is not limited to a specific shape so long as the pair of second metal films 22 is in conformity with the pair of terminals of the light-emitting element 4 mounted on the connection board 2. For example, if the pair of terminals of the light-emitting element 4 is located on a diagonal line thereof, the pair of second metal films 22 is preferably spaced apart from each other with a slit defining a right angle with the diagonal line in plan view, in the area where the light-emitting element 4 is mounted. For example, if the shape of the light-emitting element 4 is a square shape in plan view, the slit is formed to extend in a diagonal line of the square, defining an angle of 45° relative to a side of the square shape.

The connection board 2 can have a topmost layer made of a white-colored resin film that extends except the area where the light-emitting element 4 on the connection board 2 is mounted and the area where the conductive members 3 for the connection board 2 are formed. The second metal films 22 covered by a resin film with high light reflectivity improve the light-emission output of the light-emitting device 10 and 10A. Such a connection board 2 can be fabricated in the manufacturing of the original board 20 by, after forming the pattern of the second metal films 22, applying a resin material or affixing a resin film. The resin film can have any thickness so long as it can serve as a light-reflective member. However, the resin film preferably has a small thickness so as not to prevent upward heat dissipation from the second metal films 22.

Second Modification

Figure 10A:
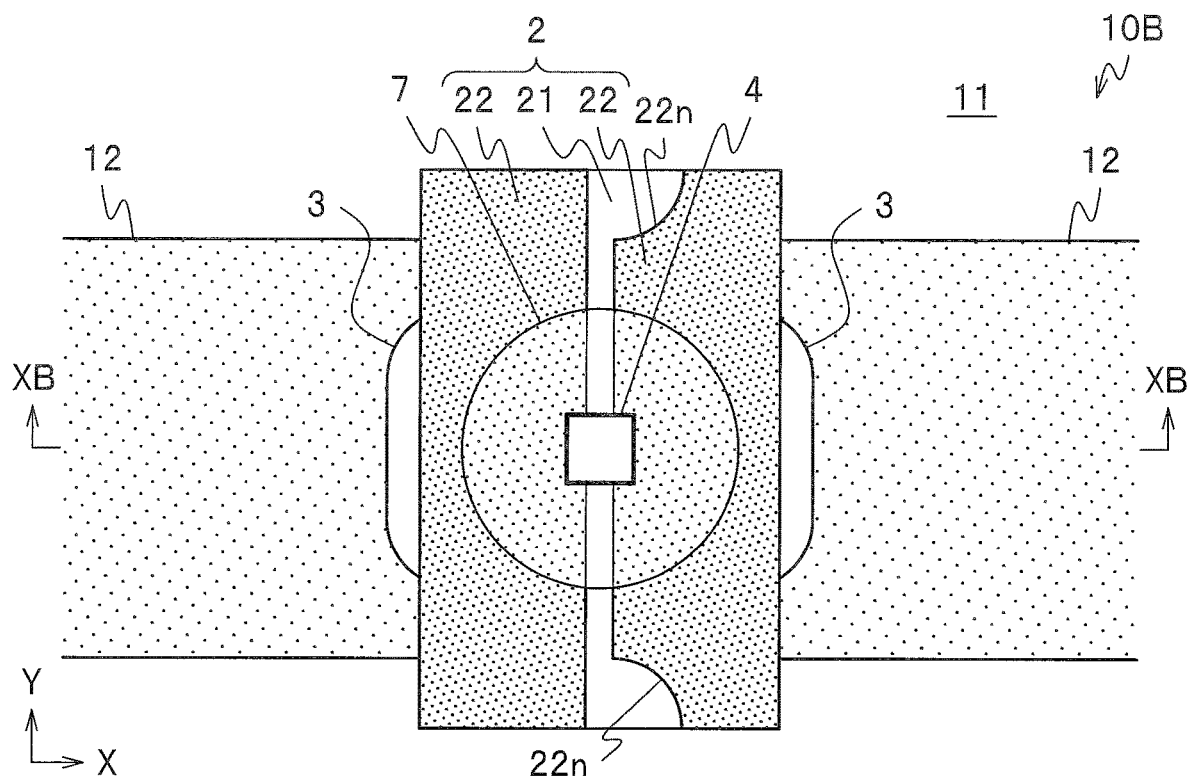
FIG. 10A is an enlarged plan view schematically illustrating a part of the configuration of the light-emitting device according to a second modification of the embodiment.
Figure 10B:
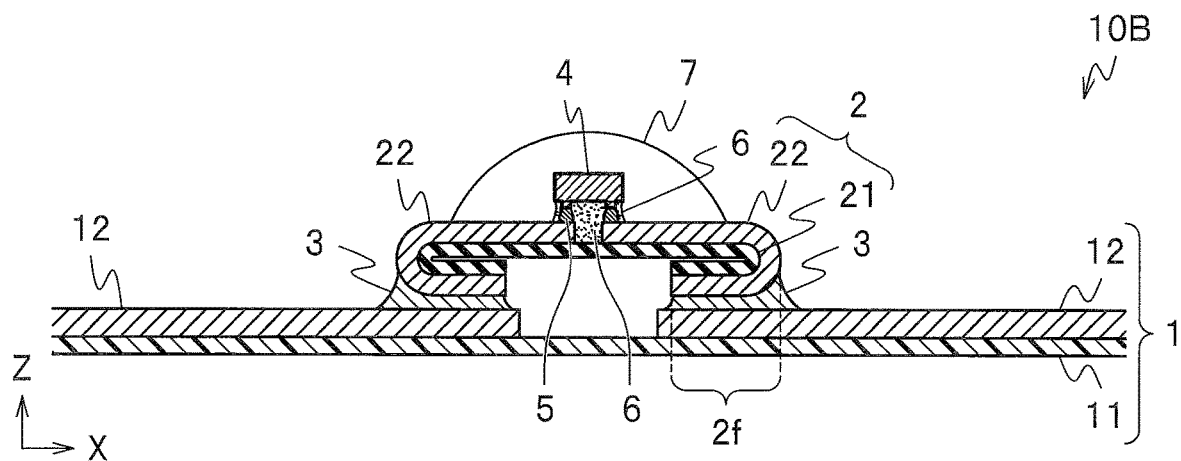
FIG. 10B is an enlarged cross-sectional view taken along line XB-XB in FIG. 10A, schematically illustrating the part of the configuration of the light-emitting device according to the second modification of the embodiment.

The connection board 2 can each have folded back portions at opposite end portions of the connection board 2, such that the folded back portions each define an angle of 180° and the second metal films 22 formed on the connection board 2 continuously extend along an outer surface of the folded back portions, from an upper surface of the connection board 2 to a back surface (lower) surface of the connection board 2. The connection board 2 with such a configuration is readily electrically connected to the support board 1 by bonding the connection board 2 to the support board 1 with a conductive member 3 being interposed therebetween when the connection board 2 is mounted on the support board 1. Hereinafter, a description will be given of the configuration of a light-emitting device according to a second modification of the embodiment with reference to FIGS. 10A and 10B. FIG. 10A is an enlarged plan view schematically illustrating a part of the configuration of the light-emitting device according to the second modification of the embodiment. FIG. 10B is an enlarged cross-sectional view taken along line XB-XB in FIG. 10A, schematically illustrating the part of the configuration of the light-emitting device according to the second modification of the embodiment.

A light-emitting device 10B according to the second modification of the embodiment has: (i) a support board 1 composed of a flexible first base 11 with a lower surface on which first metal films 12 are formed; (ii) connection boards 2 each of which is composed of a second base 21 as well as a pair of second metal films 22 formed thereon and has opposite end portions folded back in the X-axis direction at an angle of 180°, and which are disposed on an upper surface of the support board 1; (iii) light-emitting elements 4 respectively mounted on the connection boards 2; and (iv) conductive members 3 each being in contact with and interposed between corresponding one of the first metal films 12 and the connection board 2 located thereon. The light-emitting device 10B further has, for each of the connection boards 2: connection members 5 that connects terminals of the light-emitting element 4 on the connection board 2 respectively to the second metal films 22 formed on the connection board 2, an underfill material 6 filled between the light-emitting element 4 mounted on the connection board 2 and the connection board 2, and a dome-shaped light-transmissive member 7 disposed on the connection board 2 to cover the light-emitting element 4 mounted on the connection board 2. As an example, the light-emitting device 10B has a rectangular shape in plan view. The light-emitting device 10B is provided with twelve light-emitting elements 4 arranged in a 4×3 array, and is provided with the same number of connection boards 2 as the light-emitting elements 4. The light-emitting device 10B has the same configuration as that of the light-emitting device 10 according to the above-described embodiment except the shape of the connection boards 2 in plan view (as seen from the above) and the arrangement and shape of the conductive members 3. Hereinafter, the configuration of members that differ from the above-described embodiment will be described in detail.

Each connection board 2 of the second modification has a configuration similar to the one in the above-described embodiment except that the connection board 2 has opposite end portions at each of which the connection board 2 is folded back in the X-axis direction toward the back (lower) side of the connection board 2 to form folded back portions, such that the second metal films 22 formed on the upper surface of the connection board 2 are folded back along an outer surface of the folded back portions. Thus, each of the second metal films 22 has a portion located on the lower side of the connection board 2 to face corresponding one of the first metal films 12 of the support board 1. Hereinafter, end portions of the connection board 2 whose second metal films 22 face downward are each referred to as connection portion 2f. Before the connection board 2 is disposed on the support board 1, the connection board 2 is configured such that, in plan view, the connection portions 2f each have a portion outside the area where the light-transmissive member 7 is formed. In the second modification, the connection board 2 has a substantially square size with dimensions larger than the light-transmissive member 7 in plan view. Each connection portion 2f is configured to have such a width (length in the X-axis direction) that the second metal film 22 in the connection portion 2f can have a sufficient connection area to connect to the corresponding first metal film 12 via a conductive member 3 to provide necessary conductivity. The larger the connection area, the more easily the light-emitting device 10B dissipates heat. Meanwhile, the connection portions 2f, which face each other on the back side of the connection board 2, preferably have a sufficient gap therebetween, which provides margins to positions of the connection boards 2 arranged on the support board 1. In the present modification, in particular, the connection board 2 preferably has such flexibility as to be able to be folded back at an angle of 180°. Moreover, preferably, the second metal films 22 has flexibility such as not to break, and the second base 21 has a small thickness.

The conductive members 3 bond the connection portions 2f, which have been folded back to the lower side of the connection boards 2, to the first metal films 12 on the support board 1 to electrically connect the second metal films 22 of the connection boards 2 to the first metal films 12. Each conductive member 3 is formed to have a contact area for contacting a first metal film 12 and to have a contact area for contacting a second metal film 22, such that necessary electrical conductivity and adhesivity are achieved between the first metal film 12 and the metal film 22. As understood from the above, in the present modification, the conductive members 3 each serve as an electrical connection and as an adhesive. Thus, the conductive members 3 can provide sufficient adhesion alone, without a separate adhesive. Moreover, in each connection board 2, a distance through which corresponding conductive members 3 intervenes between the second metal films 22 on the connection board 2 and the corresponding first metal films 12 can be made significantly small, and the area of the contact areas where the corresponding conductive members 3 are bonded to the second metal films 22 on the connection board 2 can be made as large as the area of the connection portions 2f of the connection board 2. As a result, heat is likely to propagate from the second metal films 22 to the first metal films 12, which improves heat dissipation of the light-emitting device 10B.

When manufacturing the light-emitting device 10B, manufacturing steps up to the previous step of the connection board mounting step S30 can be carried out in the same manner as those for the light-emitting device 10. In the connection board mounting step S30 for the second modification, first, conductive members 3 prior to being hardened are applied onto the first metal films 12 in regions of the support board 1 where the connection boards 2 are to be disposed. Then, opposite end portions of each connection board 2, which has been singulated in the singulation step S20 and on which a light-emitting element 4 has been mounted, are folded back downward at an angle of 180°. After that, the connection boards 2 are placed on the support board 1 and then the conductive members 3 are hardened. That is, the connection board arrangement step S31 and the conductive member forming step S32 are carried out at the same time.

In each folded back portion of each connection board 2, portions of the second base 21 folded back inside the folded back portion can be bonded to each other. In this case, a non-electrically-conductive adhesive or a double-sided tape is applied to the second base 21 located on the back side of the connection board 2, then opposite end portions of the connection board 2 are folded back at an angle of 180°, to form folded back portions in each of which portions of the second base 21 facing with each other are bonded to each other. This structure maintains the folded back portions in which the connection board 2 has been folded back at an angle of 180° and thus facilitates placing the connection board 2 on the support board 1. Moreover, as an adhesive is applied inside the folded back portions and no adhesive is applied to the outer surface of the connection portions 2f, the connection board 2 can be strongly bonded to the support board 1 with a large bonding area. Incidentally, the connection board 2 can be bent at opposite edges spaced apart from each other in the Y-axis direction.

The conductive members 3 can be formed not only under the connection board 2 but also on the upper surface of the connection board 2 like the light-emitting device 10. This structure improves electrical conductivity and bonding strength. Alternatively, the conductive member 3 can be formed only on the upper surface of the connection board 2 and the upper surface of the support board 1, like the light-emitting device 10 of the embodiment. This structure allows portions of the second metal films 22 of the connection portion 2f of the connection board 2 to be directly in contact with the corresponding first metal films 12 to improve heat dissipation.

Even in the light-emitting device 10A according to the first modification, each connection board 2 can have folded back portions in each of which an end portion of the connection board 2 has been folded back at an angle of 180°. In this case, the holes 11h of the first base 11A of the support board 1A are formed in regions where the connection portions 2f of the connection boards 2 overlap in plan view.

In the light-emitting device 10B, each connection board 2 is provided with the second metal films 22 each continuously extending on upper and lower sides of the connection board 2. This structure is obtained by folding back the connection board 2 at an angle of 180° with the second metal film 22 being on the outer side of the connection board 2. However, the connection board 2 can have second metal films 22 folded back at an angle of 180° without folding back the connection board 2 itself, by forming the second metal films 22 on upper and lower sides and end sides of the second base 21 of the connection board 2. To fabricate an original board 20 for such connection boards 2, slit-shaped, elongated through openings are formed in a layer for second bases 21 along cutting lines CL; and then a layer for second metal films 22 is formed on the layer for second bases 21 over the whole surface thereof including upper and lower surfaces as well as inner wall surfaces of the through openings. In this case, the layer for second metal films 22 can be formed by a plating process, which includes: forming a seed layer on a whole surface of the layer for second bases 21 by, for example, electroless plating or sputtering; and electroplating metal films having a desired thickness. Alternatively, an original board 20 for such connection boards 2 can be fabricated by: preparing a layer for second bases 21 on both surfaces of which a metal foil is affixed; forming slit-shaped, elongated through openings in the layer for second bases 21 along cutting lines CL; applying conductive ink to inner wall surfaces of the through openings by printing; and then forming a pattern of second metal films 22 on both sides of the layer for second bases 21 by photolithography and etching. When light-emitting elements 4 have been mounted on that original board 20 and the original board 20 goes through a singulation process, the original board 20 is cut along the cutting lines CL such that the through openings extending along the cutting lines are divided. As a result, in plan view, each singulated connection board 2 has a rectangular shape such that opposite ends of the rectangular shape each have a notch corresponding to a part of the periphery of one of the through openings. As the notch has an end surface on which a metal film has been formed, this metal film and metal films formed on both sides of the connection board 2 form a contiguous metal film, which compose one second metal film 22. Such a connection board 2 needs not have an area for folding back the connection board 2 outside the area where a light-transmissive member 7 is to be formed as well as an area for connection with conductive members 3. Thus, the connection board 2 can be reduced in size down to the shape of the light-transmissive member 7 in plan view. The connection board 2 having such a small shape in plan view hardly hinders deformation of the light-emitting device 10B even if the connection board 2 does not have flexibility. Thus, the second base 21 can be made of a hard material.

The light-emitting devices 10, 10A, and 10B are configured to have light-emitting elements 4 connected in series. However, they need not be limited thereto. The light-emitting elements 4 can be connected in parallel, or can be connected such that series connections and parallel connections are combined. These connections can be freely selected by the pattern of first metal films 12 formed on the support board 1 or 1A.

The light-emitting elements 4 are not limited to the flip-chip mounting type. The light-emitting elements 4 can be of the face-up mounting type. In this case, the light-emitting element mounting step S10, in place of carrying out the steps S11 and S12, firstly fixes light-emitting elements 4 at predetermined positions of the original board 20 by an adhesive, and then electrically connects terminals on upper surfaces of the light-emitting elements 4 to the second metal films 22 with wires by wire-bonding. After that, the light-emitting element mounting step S10 carries out the light-transmissive member forming step S13 to form light-transmissive members 7 to seal the light-emitting elements 4 and wires. When using light-emitting elements of the face-up mounting type for the light-emitting elements 4, in each connection board 2 with a pair of second metal films 22 and a light-emitting element 4, it is preferable that the slit between the pair of second metal films 22 be located outside but in the vicinity of the light-emitting element 4 and that the whole lower surface of the light-emitting element 4 be bonded to one of the pair of second metal films 22, to improve heat dissipation.

As described, the light-emitting device according to any one of the embodiment of the present disclosure and the modifications thereof is fabricated by: fabricating connection boards on each of which a light-emitting element is mounted, fabricating a circuit board for electrically connecting the light-emitting elements mounted on the connection boards, and connecting these boards. While the light-emitting device has the same functionality as that of conventional light-emitting devices, the mounting time required per one light-emitting element is significantly reduced by mounting the light-emitting elements at narrow pitches. Moreover, as connection boards, on each of which a light-emitting element that generates light and heat is directly mounted, are made as separate members from the support board, expansion and contraction of the support board is inhibited. Moreover, the connection boards, which are prone to photodegradation or thermal degradation, can be readily replaced by configuring the connection boards to be removable from the support board, which reduces maintenance cost of the light-emitting device. The method of present disclosure is in particular effective to large light-emitting devices on which a large number of light-emitting elements are mounted at a wide arrangement pitch.

EXAMPLES

A Working Example of a light-emitting device according to the embodiment of the present disclosure and a Comparative Example of a light-emitting device were made on an experimental basis to confirm the effects of the embodiment.

In both the Working Example and the Comparative Example, a total of 100 light-emitting elements, each of which is an LED chip with a square shape having a side length of 600 µm in plan view, are disposed at an arrangement pitch of 50 mm in a 10×10 array. The LED was a blue LED having an emission peak at 450 nm.

Comparative Example

Fabrication of Board
A polyimide film with a thickness of 25 µm was cut into a square piece having a side length of 550 mm. Then, a copper foil with a thickness of 35 µm was applied to one side of the square piece. Next, the copper foil was processed by etching to make a board having 100 chip mounting portions arranged at a pitch of 50 mm.
Fabrication of Light-Emitting Device
Light-emitting elements were flip-chip mounted on the copper foils of the mounting portions using Sn—Cu based solder. After mounting 100 pieces of the light-emitting elements, resin material made by kneading titanium oxide with an average particle size of 0.25 µm into silicone resin with a mass percent of 30% was applied to peripheries of each light-emitting element to form underfill materials. Next, 100 dome-shaped light-transmissive members each for sealing a light-emitting element were formed at the same time by curing a silicone resin using a mold, to complete a light-emitting device.

Working Example

Fabrication of Connection Board
A polyimide film with a thickness of 25 µm was cut into a square piece having a side length of 550 mm. Then, a copper foil with a thickness of 35 µm was applied to one side of the square piece. Next, the copper foil was processed by etching to make a board having a total of 2500 chip mounting portions arranged at a pitch of 10 mm in a 50×50 array.
Mounting of Light-Emitting Elements
Light-emitting elements were flip-chip mounted on the copper foils of the mounting portions using Sn—Cu based solder. After mounting 2500 light-emitting elements, resin material made by kneading titanium oxide with an average particle size of 0.25 µm into silicone resin with a mass percent of 30% was applied to peripheries of each light-emitting element to form underfill materials. Next, 2500 dome-shaped light-transmissive members each for sealing a light-emitting element were formed at the same time by curing a silicone resin using a mold.
Singulation of Connection Boards
The board on which the 2500 light-emitting elements have been mounted was divided into 10 mm square connection boards on each of which one light-emitting element has been mounted, using a Thomson blade.
Fabrication of Support Board
A PET film with a thickness of 25 µm was cut into a 550 mm square piece. Then, an aluminum foil with a thickness of 50 µm was applied to one side of the square piece. Next, the aluminum foil was processed by etching to make a support board having a total of 100 connection board mounting portions arranged at a pitch of 50 mm in a 10×10 array.
Mounting of Connection Boards
The connection boards, on each of which one light-emitting element is mounted, were respectively placed on the connection board mounting portions of the support board. Then, for each of the connection boards, copper ink is applied across between each copper foil on the connection board and the corresponding aluminum foil on the support board, using a dispenser. After that, the support board was transported into an oven, and then the copper ink was dried.
Evaluation
In both of the steps for mounting the light-emitting elements on the board in the Comparative Example (fabrication of light-emitting device) as well as the steps for mounting the light-emitting elements on the board in the Working Example (up to forming light-transmissive members), it took, per board, 5 seconds for flip-chip mounting, 10 seconds for filling underfill materials, and 60 seconds for forming light-transmissive members. Thus, the fabrication time per light-emitting device of the Comparative Example was 75 (=5+10+60) seconds. Meanwhile, in the Working Example, it took 5 seconds to divide the board for singulation, and it took 10 seconds to mount the 100 connection boards on the support board. Thus, the fabrication time per light-emitting device of the Working Example was 13.2 (=(5+10+60+5)/2500×100+10) seconds. Thus, fabrication time for the Working Example was significantly shorter than that of the Comparative Example due to the configuration and the manufacturing method of the light-emitting device according to the present disclosure, despite the fact that the fabrication of the Working Example involves two stages of mounting.

INDUSTRIAL APPLICABILITY

The light-emitting devices according to the embodiments of the present disclosure can be used for backlights for liquid-crystal displays, a variety of lighting apparatuses, large format displays, various displays for advertisements or destination guide, and various light sources for digital video cameras, image scanners in apparatuses such as facsimile machines, copying machines, and scanners, projectors, and other apparatuses.

What is claimed is:

1. A method of manufacturing a light-emitting device, the method comprising:
   providing a second base with a plurality of light-emitting element, the second base having an upper surface on which a pattern of second metal films is formed, the plurality of light-emitting elements being provided on the pattern of second metal films;
   cutting the second base to singulate the second base into a plurality of connection boards on each of which respective one of the plurality of light-emitting elements is mounted;
   providing a support board including a first base, the first base being flexible, the first base including a pattern of first metal films;
   placing the plurality of connection boards on the support board; and
   forming, for each of the plurality of connection boards, a conductive member so as to be in contact with the pattern of second metal films on the connection board and with the pattern of first metal films.

2. The method according to claim 1,
   wherein the providing the second base with the plurality of light-emitting elements comprises mounting the plurality of light-emitting elements on the pattern of second metal films.

3. The method according to claim 2,
   wherein the pattern of second metal films comprises a plurality of second metal films, and
   wherein the providing the second base with the plurality of light emitting elements comprises forming a layer for the plurality of second metal films and removing portions of the layer to form the plurality of second metal films so that at least one slit defined by adjacent ones of the plurality of second metal films is formed and one of the adjacent ones of the plurality of second metal films has a notch extending from the at least one slit and having a substantially half arc shape.

4. The method according to claim 3,
   wherein the mounting the plurality of light-emitting elements on the pattern of second metal films comprises disposing each of the plurality of light-emitting elements on the pattern of second metal films across a corresponding one of the at least one slit.

5. The method according to claim 3,
   wherein the notch with the substantially half arc shape is a first notch, and wherein the second base is cut so as to divide the adjacent ones of the plurality of second metal films into two pieces each comprising a second notch with a substantially quarter arc shape, the second notch being formed by dividing the first notch.

6. The method according to claim 2,
   wherein the mounting the plurality of light-emitting elements on the pattern of second metal films comprises mounting the plurality of light-emitting elements on the pattern of second metal films with all the plurality of light-emitting elements being oriented in a same direction.

7. The method according to claim 1, further comprising:
   sealing, before cutting the second base, each of the plurality of light-emitting elements mounted on the pattern of second metal films with a light-transmissive member.

8. The method according to claim 7, further comprising:
   filling, before sealing each of the plurality of light-emitting elements, an underfill material into a gap between each of the plurality of light-emitting elements and the second base.

9. The method according to claim 1,
   wherein the pattern of second metal films comprises a plurality of second metal films,
   wherein the providing the second base with the plurality of light emitting elements comprises:
      forming slit-shaped, elongated through openings in the second base, and
      forming the plurality of second metal films so that each of the plurality of second metal films extends to an inner wall surface of a corresponding one of the through openings, and
   wherein the second base is cut along the through openings.

10. The method according to claim 1,
    wherein the pattern of first metal films of the support member is formed on a surface opposite to a surface on which the plurality of connection boards are to be placed, and
    wherein the support board comprises pairs of rectangular holes at places corresponding to the pattern of first metal films, the rectangular holes of each of the pairs being spaced apart across a region where a corresponding one of the plurality of connection boards is to be placed.

11. The method according to claim 1,
    wherein the providing the second base with the plurality of light emitting elements comprises:
    forming the pattern of second films; and
    applying, after the pattern of second films are formed, a white-colored resin film on the upper surface of the second base so that the white-colored resin film extends on the upper surface except areas where the plurality of light-emitting elements are mounted and areas where the conductive member of each of the plurality of connection boards is to be formed.

12. The method according to claim 1,
    wherein the forming the conductive member comprises, in order:
    applying, for each of the plurality of connection boards, a material of the conductive member prior to being hardened onto the pattern of the first metal films; and
    placing the connection board on the support board.

13. The method according to claim 12, the method further comprising, after the second base is cut, folding back opposite ends of each of the plurality of connection boards downward at an angle of 180° so that the pattern of second metal films continuously extends along an outer surface of folded back portions of the opposite ends, from an upper side of the connection board to a back side of the connection board.

14. The method according to claim 13, wherein the forming the conductive member further comprises placing each connection board whose opposite ends have been folded back downward at an angle of 180° on the pattern of first metal films on which the material of the conductive member has been applied.

15. The method according to claim 1, wherein the providing the second base with the plurality of light emitting elements comprises forming slit-shaped, elongated through openings in the second base, and wherein the second base is cut along the slit-shaped, elongated through openings formed in the second base.

16. The method according to claim 15, wherein the providing the second base with the plurality of light emitting elements comprises forming a layer for the pattern of second metal films over an entire surface of the second base, the entire surface including the upper surface and a lower surface of the second base and inner wall surfaces of the slit-shaped, elongated through openings.

\* \* \* \* \*